(12) United States Patent
Zybura et al.

(10) Patent No.: US 10,796,835 B2
(45) Date of Patent: Oct. 6, 2020

(54) STACKED LAMINATE INDUCTORS FOR HIGH MODULE VOLUME UTILIZATION AND PERFORMANCE-COST-SIZE-PROCESSING-TIME TRADEOFF

(71) Applicant: Qorvo US, Inc., Greensboro, NC (US)

(72) Inventors: Michael F. Zybura, Scotts Valley, CA (US); George Maxim, Saratoga, CA (US); Dirk Robert Walter Leipold, San Jose, CA (US); John August Orlowski, Summerfield, NC (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 281 days.

(21) Appl. No.: 15/208,780

(22) Filed: Jul. 13, 2016

(65) Prior Publication Data
US 2017/0062119 A1    Mar. 2, 2017

Related U.S. Application Data

(60) Provisional application No. 62/208,930, filed on Aug. 24, 2015.

(51) Int. Cl.
*H01F 27/30* (2006.01)
*H01F 17/00* (2006.01)
(Continued)

(52) U.S. Cl.
CPC ....... *H01F 17/0013* (2013.01); *H01F 27/292* (2013.01); *H01L 23/48* (2013.01);
(Continued)

(58) Field of Classification Search
CPC ....... H01L 2224/32145; H01L 25/0657; H01L 2924/30107; H01L 23/5227; H01L 2225/06541; H01L 28/10
(Continued)

(56) References Cited

U.S. PATENT DOCUMENTS 2,014,524 A * 9/1935 Franz ............... H01G 4/26
174/261
2,874,360 A * 2/1959 Eisler ............... 336/180
(Continued)

FOREIGN PATENT DOCUMENTS

EP    0957368 A2    11/1999
EP    1184977 A2     3/2002
(Continued)

OTHER PUBLICATIONS

Final Office Action for U.S. Appl. No. 14/215,800, dated Feb. 8, 2017, 7 pages.
(Continued)

*Primary Examiner* — Elvin G Enad
*Assistant Examiner* — Joselito Baisa
(74) *Attorney, Agent, or Firm* — Withrow & Terranova, P.L.L.C.

(57) ABSTRACT

Embodiments of electronic devices, such as integrated circuit (IC) packages are disclosed. In one embodiment, an electronic device includes a first substrate and a second substrate. The first substrate has a first substrate body and a first inductor portion integrated into the first substrate body. Additionally, the second substrate comprises a second substrate body and a second inductor portion integrated into the second substrate body. The second substrate is mounted on the first substrate such that such that the second inductor portion is positioned over the first inductor portion and such that the second inductor portion is electrically connected to the first inductor portion so that the first inductor portion and the second inductor portion form a three dimensional (3D) inductor. By using two substrates, the 3D inductor can be increased in height while still allowing the substrates to be miniaturized and standardized for an IC package.

21 Claims, 14 Drawing Sheets

(51) Int. Cl.
  *H01F 27/29* (2006.01)
  *H01L 23/48* (2006.01)
  *H01L 23/498* (2006.01)
  *H05K 1/16* (2006.01)

(52) U.S. Cl.
  CPC ............ *H01L 23/49822* (2013.01); *H01F 2017/0086* (2013.01); *H05K 1/165* (2013.01); *H05K 2201/10674* (2013.01)

(58) Field of Classification Search
  USPC .............................. 336/200, 208; 257/531
  See application file for complete search history.

(56) References Cited

U.S. PATENT DOCUMENTS

| | | |
|---|---|---|
| 3,465,431 A | 9/1969 | Henning |
| 3,491,318 A | 1/1970 | Henning et al. |
| 3,597,709 A | 8/1971 | Rhodes |
| 3,718,874 A | 2/1973 | Cooper, Jr. |
| 3,794,941 A | 2/1974 | Templin |
| 4,169,252 A | 9/1979 | Muszkiewicz |
| 4,296,440 A * | 10/1981 | Rosenheck ........ H04N 1/33315 358/409 |
| 4,361,894 A | 11/1982 | Kurihara et al. |
| 4,484,345 A | 11/1984 | Stearns |
| 4,816,784 A | 3/1989 | Rabjohn |
| 4,894,566 A | 1/1990 | Rush |
| 5,296,831 A * | 3/1994 | Suzuki ................ G11B 7/0935 174/254 |
| 5,339,017 A | 8/1994 | Yang |
| 5,517,083 A | 5/1996 | Whitlock |
| 5,608,363 A | 3/1997 | Cameron et al. |
| 5,661,414 A | 8/1997 | Shigehara et al. |
| 5,689,144 A | 11/1997 | Williams |
| 5,757,247 A | 5/1998 | Koukkari et al. |
| 5,841,330 A | 11/1998 | Wenzel et al. |
| 5,880,620 A | 3/1999 | Gitlin et al. |
| 5,896,073 A | 4/1999 | Miyazaki et al. |
| 5,963,557 A | 10/1999 | Eng |
| 6,150,901 A | 11/2000 | Auken |
| 6,215,374 B1 | 4/2001 | Petrovic |
| 6,233,438 B1 | 5/2001 | Wynn |
| 6,239,673 B1 | 5/2001 | Wenzel et al. |
| 6,362,986 B1 | 3/2002 | Schultz et al. |
| 6,522,217 B1 | 2/2003 | Shen |
| 6,529,750 B1 | 3/2003 | Zhang et al. |
| 6,664,873 B2 | 12/2003 | Tiihonen |
| 6,801,102 B2 | 10/2004 | Shamsaifar et al. |
| 6,806,793 B2 | 10/2004 | Bhatia et al. |
| 6,809,421 B1 * | 10/2004 | Hayasaka ......... H01L 21/76898 257/621 |
| 7,015,870 B2 | 3/2006 | Guitton et al. |
| 7,116,186 B2 | 10/2006 | Chen |
| 7,164,339 B2 | 1/2007 | Huang |
| 7,253,712 B1 * | 8/2007 | Papananos ......... H01F 27/2804 336/200 |
| 7,336,939 B2 | 2/2008 | Gomez |
| 7,378,733 B1 * | 5/2008 | Hoang .................... H01L 23/50 257/724 |
| 7,570,129 B2 * | 8/2009 | Kintis ...................... H01P 5/10 333/25 |
| 7,573,350 B2 | 8/2009 | Frank |
| 7,741,943 B2 * | 6/2010 | Fouquet .............. H01F 27/2804 336/200 |
| 7,795,995 B2 | 9/2010 | White et al. |
| 7,809,349 B1 | 10/2010 | Granger-Jones et al. |
| 7,825,751 B2 | 11/2010 | Kawaguchi et al. |
| 7,852,186 B2 * | 12/2010 | Fouquet .................. H01F 19/08 336/107 |
| 8,103,233 B2 | 1/2012 | Im et al. |
| 8,193,781 B2 * | 6/2012 | Lin ........................ H02K 3/26 322/3 |
| 8,204,446 B2 | 6/2012 | Scheer et al. |
| 8,258,911 B2 * | 9/2012 | Fouquet .................. H01F 19/08 336/170 |
| 8,269,575 B2 | 9/2012 | Frye et al. |
| 8,314,653 B1 | 11/2012 | Granger-Jones et al. |
| 8,346,179 B2 | 1/2013 | Brunn et al. |
| 8,369,250 B1 | 2/2013 | Khlat |
| 8,400,232 B2 | 3/2013 | Leong et al. |
| 8,626,083 B2 | 1/2014 | Greene et al. |
| 8,736,511 B2 | 5/2014 | Morris, III |
| 8,742,871 B2 | 6/2014 | Jin et al. |
| 8,751,993 B1 | 6/2014 | Fenzi et al. |
| 8,791,769 B2 | 7/2014 | Leong et al. |
| 8,803,632 B2 | 8/2014 | Takeuchi |
| 8,803,634 B2 | 8/2014 | Hanaoka |
| 8,841,983 B2 | 9/2014 | Newton et al. |
| 8,862,089 B2 | 10/2014 | Wang et al. |
| 8,884,714 B2 | 11/2014 | Carey et al. |
| 8,977,216 B2 | 3/2015 | Weissman et al. |
| 9,002,309 B2 | 4/2015 | Sahota et al. |
| 9,048,112 B2 * | 6/2015 | Pan .................. H01L 23/49822 |
| 9,054,648 B1 | 6/2015 | Ku |
| 9,094,104 B2 | 7/2015 | Din et al. |
| 9,124,355 B2 | 9/2015 | Black et al. |
| 9,203,455 B2 | 12/2015 | Yang et al. |
| 9,369,162 B2 | 6/2016 | Lo et al. |
| 9,385,055 B2 * | 7/2016 | Refai-Ahmed ......... H01L 23/04 |
| 9,391,650 B2 | 7/2016 | Aparin |
| 9,472,332 B2 * | 10/2016 | Nakamura .......... H01F 17/0013 |
| 9,608,595 B1 | 3/2017 | Raihn et al. |
| 9,721,903 B2 * | 8/2017 | Lee ...................... H01L 23/552 |
| 2001/0020877 A1 | 9/2001 | Hasegawa et al. |
| 2002/0057139 A1 | 5/2002 | Matsumura et al. |
| 2003/0008577 A1 | 1/2003 | Quigley et al. |
| 2003/0008628 A1 | 1/2003 | Lindell et al. |
| 2003/0128084 A1 | 7/2003 | Chang et al. |
| 2003/0151409 A1 | 8/2003 | Marek |
| 2003/0155988 A1 | 8/2003 | Douziech et al. |
| 2003/0222732 A1 | 12/2003 | Matthaei |
| 2004/0127178 A1 | 7/2004 | Kuffner |
| 2004/0130414 A1 | 7/2004 | Marquardt et al. |
| 2004/0162042 A1 | 8/2004 | Chen et al. |
| 2004/0182602 A1 | 9/2004 | Satoh et al. |
| 2004/0196085 A1 | 10/2004 | Shen |
| 2004/0222868 A1 | 11/2004 | Rathgeber et al. |
| 2004/0227578 A1 | 11/2004 | Hamalainen |
| 2004/0266378 A1 | 12/2004 | Fukamachi et al. |
| 2005/0190035 A1 * | 9/2005 | Wang ................... H01F 17/0013 336/200 |
| 2005/0195063 A1 | 9/2005 | Mattsson |
| 2005/0237144 A1 | 10/2005 | Einzinger et al. |
| 2006/0033602 A1 | 2/2006 | Mattsson |
| 2006/0035600 A1 | 2/2006 | Lee et al. |
| 2006/0038635 A1 | 2/2006 | Richiuso et al. |
| 2006/0055050 A1 * | 3/2006 | Numata ........... H01L 21/76898 257/774 |
| 2006/0058629 A1 | 3/2006 | Warntjes et al. |
| 2006/0109064 A1 | 5/2006 | Toncich et al. |
| 2006/0125465 A1 | 6/2006 | Xiang et al. |
| 2006/0220727 A1 | 10/2006 | Yen |
| 2006/0226943 A1 | 10/2006 | Marques |
| 2006/0261890 A1 | 11/2006 | Floyd et al. |
| 2006/0281431 A1 | 12/2006 | Isaac et al. |
| 2007/0091006 A1 | 4/2007 | Thober et al. |
| 2007/0161361 A1 | 7/2007 | Vaisanen et al. |
| 2007/0182520 A1 | 8/2007 | Kawakubo et al. |
| 2007/0194859 A1 | 8/2007 | Brobston et al. |
| 2007/0241839 A1 | 10/2007 | Taniguchi |
| 2007/0290767 A1 | 12/2007 | Ali-Ahmad et al. |
| 2008/0002380 A1 * | 1/2008 | Hazucha ................ H05K 1/165 361/760 |
| 2008/0096516 A1 | 4/2008 | Mun et al. |
| 2008/0122560 A1 | 5/2008 | Liu |
| 2008/0197963 A1 * | 8/2008 | Muto ................... H01F 17/0013 336/200 |
| 2008/0220735 A1 | 9/2008 | Kim et al. |
| 2008/0297299 A1 | 12/2008 | Yun et al. |
| 2009/0058589 A1 | 3/2009 | Chen et al. |
| 2009/0088110 A1 | 4/2009 | Schuur et al. |
| 2009/0134947 A1 | 5/2009 | Tarng |

(56) References Cited

U.S. PATENT DOCUMENTS

| | | |
|---|---|---|
| 2009/0134953 A1 | 5/2009 | Hunt et al. |
| 2009/0167460 A1 | 7/2009 | Akasegawa et al. |
| 2009/0261936 A1 | 10/2009 | Widjaja et al. |
| 2009/0289721 A1 | 11/2009 | Rajendran et al. |
| 2010/0060354 A1 | 3/2010 | Maeda |
| 2010/0144305 A1 | 6/2010 | Cook et al. |
| 2010/0148344 A1* | 6/2010 | Chandra ............ H01L 23/5385 257/690 |
| 2010/0188171 A1 | 7/2010 | Mohajer-Iravani et al. |
| 2010/0283557 A1 | 11/2010 | Taniguchi |
| 2011/0010749 A1 | 1/2011 | Alkan |
| 2011/0050384 A1* | 3/2011 | Chen .................... H01H 37/761 337/296 |
| 2011/0103494 A1 | 5/2011 | Ahmadi |
| 2011/0156835 A1 | 6/2011 | Nagai |
| 2011/0159834 A1 | 6/2011 | Salvi |
| 2011/0163824 A1 | 7/2011 | Kawano |
| 2011/0169589 A1 | 7/2011 | Franzon et al. |
| 2011/0210787 A1 | 9/2011 | Lee et al. |
| 2011/0241163 A1 | 10/2011 | Liu et al. |
| 2012/0051409 A1 | 3/2012 | Brobston et al. |
| 2012/0081192 A1 | 4/2012 | Hanaoka |
| 2012/0139090 A1* | 6/2012 | Kim ........................ H01L 25/16 257/659 |
| 2012/0230227 A1 | 9/2012 | Weiss |
| 2012/0249266 A1 | 10/2012 | Lim et al. |
| 2012/0262252 A1 | 10/2012 | Tseng et al. |
| 2012/0280366 A1* | 11/2012 | Kamgaing ............ H01L 23/481 257/621 |
| 2012/0286900 A1 | 11/2012 | Kadota et al. |
| 2013/0049902 A1 | 2/2013 | Hendry et al. |
| 2013/0143381 A1 | 6/2013 | Kikukawa |
| 2013/0176013 A1* | 7/2013 | Takemae ............. H01L 21/8252 323/311 |
| 2013/0221526 A1* | 8/2013 | Lange .................... H01L 21/50 257/750 |
| 2013/0244591 A1 | 9/2013 | Weissman et al. |
| 2013/0257564 A1* | 10/2013 | Huang .................. H01L 23/147 333/177 |
| 2013/0281031 A1 | 10/2013 | Gingrich et al. |
| 2013/0295863 A1 | 11/2013 | Shanan |
| 2014/0015603 A1 | 1/2014 | Scott et al. |
| 2014/0035358 A1 | 2/2014 | Ichikawa |
| 2014/0106698 A1 | 4/2014 | Mi et al. |
| 2014/0113573 A1 | 4/2014 | Khatri et al. |
| 2014/0133189 A1 | 5/2014 | Worek |
| 2014/0141738 A1 | 5/2014 | Janesch |
| 2014/0146737 A1 | 5/2014 | Ohshima et al. |
| 2014/0162712 A1 | 6/2014 | Feld et al. |
| 2014/0167877 A1 | 6/2014 | Shimizu et al. |
| 2014/0192845 A1 | 7/2014 | Szini et al. |
| 2014/0225680 A1 | 8/2014 | Fujiwara et al. |
| 2014/0232467 A1 | 8/2014 | Mukai et al. |
| 2014/0266531 A1 | 9/2014 | Leipold et al. |
| 2014/0285286 A1 | 9/2014 | Bojer |
| 2014/0323046 A1 | 10/2014 | Asai et al. |
| 2014/0323071 A1 | 10/2014 | Liao |
| 2014/0328220 A1 | 11/2014 | Khlat et al. |
| 2014/0361848 A1 | 12/2014 | Leipold et al. |
| 2014/0361849 A1 | 12/2014 | Maxim et al. |
| 2014/0361852 A1 | 12/2014 | Leipold et al. |
| 2014/0364077 A1 | 12/2014 | Maxim et al. |
| 2015/0001708 A1* | 1/2015 | Lin .................... H01L 23/49811 257/737 |
| 2015/0002240 A1 | 1/2015 | Reiha |
| 2015/0035612 A1 | 2/2015 | Maxim et al. |
| 2015/0035617 A1 | 2/2015 | Leipold et al. |
| 2015/0035622 A1 | 2/2015 | Maxim et al. |
| 2015/0035637 A1 | 2/2015 | Maxim et al. |
| 2015/0038094 A1 | 2/2015 | Maxim et al. |
| 2015/0038101 A1 | 2/2015 | Maxim et al. |
| 2015/0042399 A1 | 2/2015 | Imbornone et al. |
| 2015/0056939 A1 | 2/2015 | Ong et al. |
| 2015/0061680 A1 | 3/2015 | Leskowitz |
| 2015/0065070 A1 | 3/2015 | Maxim et al. |
| 2015/0084699 A1 | 3/2015 | Maxim et al. |
| 2015/0084713 A1 | 3/2015 | Maxim et al. |
| 2015/0084718 A1 | 3/2015 | Maxim et al. |
| 2015/0092625 A1 | 4/2015 | Leipold et al. |
| 2015/0094008 A1 | 4/2015 | Maxim et al. |
| 2015/0102887 A1 | 4/2015 | Park |
| 2015/0116950 A1 | 4/2015 | Yoo et al. |
| 2015/0117280 A1 | 4/2015 | Khlat et al. |
| 2015/0117281 A1 | 4/2015 | Khlat et al. |
| 2017/0084991 A1 | 3/2017 | Mayo |

FOREIGN PATENT DOCUMENTS

| | | |
|---|---|---|
| JP | 06082539 A | 3/1994 |
| JP | 07015253 A | 1/1995 |
| JP | 2010141827 A | 6/2010 |
| KR | 100812098 B1 | 3/2008 |
| WO | 0146971 A1 | 6/2001 |
| WO | 2005117255 A1 | 12/2005 |

OTHER PUBLICATIONS

Final Office Action for U.S. Appl. No. 14/298,863, dated Feb. 14, 2017, 10 pages.

Final Office Action for U.S. Appl. No. 14/450,028, dated Jan. 19, 2017, 12 pages.

Final Office Action for U.S. Appl. No. 14/449,764, dated Mar. 2, 2017, 10 pages.

Non-Final Office Action for U.S. Appl. No. 14/450,204, dated Feb. 1, 2017, 9 pages.

Notice of Allowance and Examiner-Initiated Interview Summary for U.S. Appl. No. 14/450,200, dated Feb. 10, 2017, 8 pages.

Corrected Notice of Allowability for U.S. Appl. No. 14/450,200, dated Mar. 1, 2017, 3 pages.

Non-Final Office Action for U.S. Appl. No. 14/555,557, dated Feb. 13, 2017, 21 pages.

Non-Final Office Action for U.S. Appl. No. 14/554,975, dated Feb. 16, 2017, 9 pages.

Notice of Allowance for U.S. Appl. No. 15/223,416, dated Feb. 28, 2017, 8 pages.

Non-Final Office Action for U.S. Appl. No. 15/240,420, dated Jan. 26, 2017, 7 pages.

Non-Final Office Action for U.S. Appl. No. 15/241,823, dated Jan. 17, 2017, 6 pages.

Advisory Action for U.S. Appl. No. 14/215,800, dated Apr. 20, 2017, 2 pages.

Notice of Allowance for U.S. Appl. No. 14/298,863, dated May 31, 2017, 6 pages.

Final Office Action for U.S. Appl. No. 14/450,156, dated Apr. 27, 2017, 12 pages.

Notice of Allowance for U.S. Appl. No. 14/450,028, dated May 3, 2017, 5 pages.

Notice of Allowance and Examiner-Initiated Interview Summary for U.S. Appl. No. 14/449,764, dated May 19, 2017, 8 pages.

Notice of Allowance for U.S. Appl. No. 14/555,371, dated Mar. 31, 2017, 8 pages.

Notice of Allowance for U.S. Appl. No. 15/240,420, dated May 10, 2017, 8 pages.

Notice of Allowance for U.S. Appl. No. 15/241,823, dated May 9, 2017, 7 pages.

Hoppenjans, Eric E. et al., "A Vertically Integrated Tunable UHF Filter," International Microwave Symposium Digest (MTT), May 23-28, 2010, Anaheim, California, IEEE, pp. 1380-1383.

Joshi, H. et al., "Tunable high Q narrow-band triplexer," IEEE MTT-S International Microwave Symposium Digest, Jun. 7-12, 2009, Boston, MA, IEEE, pp. 1477-1480.

Kamali-Sarvestani, Reza et al., "Fabrication of High Quality Factor RF-Resonator Using Embedded Inductor and Via Capacitor," IECON 2010—36th Annual Conference on IEEE Industrial Electronics Society, Nov. 7-10, 2010, Glendale, Arizona, IEEE, pp. 2283-2287.

International Search Report and Written Opinion for PCT/US2014/030431, dated Jun. 20, 2014, 14 pages.

(56) References Cited

OTHER PUBLICATIONS

International Preliminary Report on Patentability for PCT/US/2014/030431, dated Sep. 24, 2015, 10 pages.
Non-Final Office Action for U.S. Appl. No. 14/215,800, dated Nov. 20, 2015, 5 pages.
Final Office Action for U.S. Appl. No. 14/215,800, dated Mar. 11, 2016, 6 pages.
Non-Final Office Action for U.S. Appl. No. 14/215,800, dated Aug. 11, 2016, 6 pages.
Invitation to Pay Additional Fees and, Where Applicable, Protest Fee for PCT/US2014/048608, dated Oct. 21, 2014, 7 pages.
International Search Report and Written Opinion for PCT/US2014/048608, dated Dec. 16, 2014, 18 pages.
International Preliminary Report on Patentability for PCT/US2014/048608, dated Feb. 11, 2016, 14 pages.
Non-Final Office Action for U.S. Appl. No. 14/298,829, dated Jun. 22, 2015, 8 pages.
Final Office Action for U.S. Appl. No. 14/298,829, dated Feb. 3, 2016, 10 pages.
Notice of Allowance for U.S. Appl. No. 14/298,829, dated May 20, 2016, 9 pages.
Non-Final Office Action for U.S. Appl. No. 14/298,830, dated Dec. 3, 2015, 10 pages.
Notice of Allowance for U.S. Appl. No. 14/298,830, dated Apr. 7, 2016, 9 pages.
Non-Final Office Action for U.S. Appl. No. 14/298,863, dated Jan. 7, 2016, 16 pages.
Final Office Action for U.S. Appl. No. 14/298,863, dated Jun. 3, 2016, 17 pages.
Non-Final Office Action for U.S. Appl. No. 14/449,913, dated Mar. 28, 2016, 15 pages.
Final Office Action for U.S. Appl. No. 14/449,913, dated Sep. 7, 2016, 14 pages.
Non-Final Office Action for U.S. Appl. No. 14/298,852, dated Dec. 22, 2015, 7 pages.
Notice of Allowance for U.S. Appl. No. 14/298,852, dated May 13, 2016, 9 pages.
Notice of Allowance for U.S. Appl. No. 14/298,852, dated Jul. 13, 2016, 9 pages.
Non-Final Office Action for U.S. Appl. No. 14/450,156, dated Mar. 14, 2016, 11 pages.
Non-Final Office Action for U.S. Appl. No. 14/450,156, dated Sep. 15, 2016, 11 pages.
Non-Final Office Action for U.S. Appl. No. 14/450,028, dated Dec. 10, 2015, 11 pages.
Final Office Action for U.S. Appl. No. 14/450,028, dated Mar. 31, 2016, 12 pages.
Advisory Action for U.S. Appl. No. 14/450,028, dated Aug. 2, 2016, 3 pages.
Non-Final Office Action for U.S. Appl. No. 14/449,764, dated May 4, 2016, 12 pages.
Non-Final Office Action for U.S. Appl. No. 14/450,199, dated Apr. 20, 2016, 7 pages.
Notice of Allowance for U.S. Appl. No. 14/450,199, dated Aug. 1, 2016, 7 pages.
Non-Final Office Action for U.S. Appl. No. 14/450,204, dated Apr. 22, 2016, 8 pages.
Non-Final Office Action for U.S. Appl. No. 14/555,053, dated Dec. 31, 2015, 5 pages.
Notice of Allowance for U.S. Appl. No. 14/555,053, dated Apr. 19, 2016, 7 pages.
Non-Final Office Action for U.S. Appl. No. 14/450,200, dated Feb. 29, 2016, 13 pages.
Final Office Action for U.S. Appl. No. 14/450,200, dated Jun. 14, 2016, 13 pages.
Non-Final Office Action for U.S. Appl. No. 14/450,200, dated Sep. 8, 2016, 14 pages.
Non-Final Office Action for U.S. Appl. No. 14/554,943, dated Jun. 30, 2016, 14 pages.
Non-Final Office Action for U.S. Appl. No. 14/555,557, dated Jun. 13, 2016, 28 pages.
Non-Final Office Action for U.S. Appl. No. 14/298,863, dated Sep. 26, 2016, 9 pages.
Non-Final Office Action for U.S. Appl. No. 14/450,028, dated Sep. 26, 2016, 14 pages.
Non-Final Office Action for U.S. Appl. No. 14/449,764, dated Oct. 17, 2016, 10 pages.
Final Office Action for U.S. Appl. No. 14/555,557, dated Sep. 20, 2016, 23 pages.
Non-Final Office Action for U.S. Appl. No. 14/553,371, dated Oct. 25, 2016, 19 pages.
Non-Final Office Action for U.S. Appl. No. 14/215,800, dated Aug. 15, 2017, 6 pages.
Notice of Allowance for U.S. Appl. No. 14/450,156, dated Oct. 11, 2017, 10 pages.
Supplemental Notice of Allowability for U.S. Appl. No. 14/450,204, dated Aug. 28, 2017, 5 pages.
Notice of Allowance for U.S. Appl. No. 14/554,943, dated Aug. 31, 2017, 7 pages.
Final Office Action for U.S. Appl. No. 14/555,557, dated Aug. 7, 2017, 21 pages.
Notice of Allowance for U.S. Appl. No. 14/215,800, dated Jan. 9, 2018, 8 pages.
Advisory Action for U.S. Appl. No. 14/555,557, dated Nov. 3, 2017, 3 pages.
Notice of Allowance for U.S. Appl. No. 15/587,581, dated Dec. 8, 2017, 7 pages.
Notice of Allowance for U.S. Appl. No. 14/450,204, dated Jun. 28, 2017, 8 pages.
Notice of Allowance and Examiner-Initiated Inteview Summary for U.S. Appl. No. 14/554,975, dated Jul. 17, 2017, 9 pages.
Non-Final Office Action for U.S. Appl. No. 15/587,581, dated Jun. 30, 2017, 6 pages.
Non-Final Office Action for U.S. Appl. No. 15/415,538, dated Jul. 17, 2017, 18 pages.
Notice of Allowance for U.S. Appl. No. 14/449,913, dated Dec. 7, 2016, 7 pages.
Notice of Allowance and Examiner-Initiated Interview Summary for U.S. Appl. No. 14/554,943, dated Nov. 16, 2016, 8 pages.
Notice of Allowance for U.S. Appl. No. 15/223,416, dated Dec. 2, 2016, 8 pages.
Non-Final Office Action for U.S. Appl. No. 15/961,299, dated Sep. 5, 2018, 10 pages.
Final Office Action for U.S. Appl. No. 15/961,299, dated Mar. 5, 2019, 11 pages.
Non-Final Office Action for U.S. Appl. No. 15/717,525, dated Mar. 4, 2019, 10 pages.
Notice of Allowance for U.S. Appl. No. 15/972,917, dated Jan. 28, 2019, 7 pages.
Non-Final Office Action for U.S. Appl. No. 15/961,299, dated Jun. 25, 2019, 11 pages.
Notice of Allowance and Examiner-Initiated Interview Summary for U.S. Appl. No. 15/717,525, dated Jun. 26, 2019, 10 pages.
Final Office Action for U.S. Appl. No. 15/961,299, dated Dec. 31, 2019, 13 pages.
Non-Final Office Action for U.S. Appl. No. 15/835,041, dated Feb. 28, 2020, 14 pages.
Non-Final Office Action for U.S. Appl. No. 15/961,299, dated May 1, 2020, 12 pages.

* cited by examiner

STACKED LAMINATE INDUCTORS FOR HIGH MODULE VOLUME UTILIZATION AND PERFORMANCE-COST-SIZE-PROCESSING-TIME TRADEOFF

RELATED APPLICATIONS

This application claims the benefit of provisional patent application Ser. No. 62/208,930, filed Aug. 24, 2015, the disclosure of which is hereby incorporated herein by reference in its entirety.

FIELD OF THE DISCLOSURE

This disclosure relates generally to integrated circuit (IC) components and IC packages.

BACKGROUND

Integrated circuit (IC) packages are continuing a trend toward miniaturization and standardization. For example, package laminates within IC packages are being constructed to be thinner and thinner. This often limits the number of metallic layers that can be utilized to form electronic components within the IC package and thus a height of the electronic component. This is particularly troublesome for electronic components such as inductors, since often a quality (Q) factor of the inductor is determined by the inductor's height. Therefore, arrangements for inductors are needed that can increase the height of the inductors while still allowing for miniaturization and standardization of IC packages.

SUMMARY

Embodiments of electronic devices, such as integrated circuit (IC) packages are disclosed. In one embodiment, an electronic device includes a first substrate and a second substrate. The first substrate has a first substrate body and a first inductor portion integrated into the first substrate body. Additionally, the second substrate comprises a second substrate body and a second inductor portion integrated into the second substrate body. The second substrate is mounted on the first substrate such that such that the second inductor portion is positioned over the first inductor portion and such that the second inductor portion is electrically connected to the first inductor portion so that the first inductor portion and the second inductor portion form a three dimensional (3D) inductor. By using two substrates, the 3D inductor can be increased in height while still allowing the substrates to be miniaturized and standardized for an IC package.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates generally to electronic devices that are used to form integrated circuit (IC) components. More specifically, the electronic devices are used to form embodiments of three dimensional (3D) inductors. For example, the electronic device may be an IC package wherein the IC package is used to form the 3D inductor. Exemplary IC packages may have standardized heights in a range between 0.6 mm to 1 mm. Regarding miniaturization of assemblies, the trend is toward a continuous reduction of the application board height. Typically, the IC package will include a package substrate. This package substrate typically will need to have a particular number of substrate layers and metallic layers. For example, package substrates customarily may have four to eight substrate layers in the range of 0.15 mm to 0.25 mm and an overmold taking at least another 0.05 mm to 0.15 mm. This may not be a sufficient height to provide a 3D inductor with an adequate quality (Q) factor.

Accordingly, to increase the height of a 3D inductor and thus its Q factor, two substrates are used to form the 3D inductor. For example, the package substrate of the IC package may be formed to include a first inductor portion of the 3D inductor. Additionally, an auxiliary substrate may be provided with a second inductor portion of the 3D inductor. The auxiliary substrate is mounted on the package substrate such that the second inductor portion is positioned over the first inductor portion and such that the second inductor portion is electrically connected to the first inductor portion so that the first inductor portion and the second inductor portion form the 3D inductor. By using two substrates, the 3D inductor height is not limited by the package substrate, and thus 3D inductors with higher Q factors can be formed while still maintaining the package substrate standardized.

Figure 1:
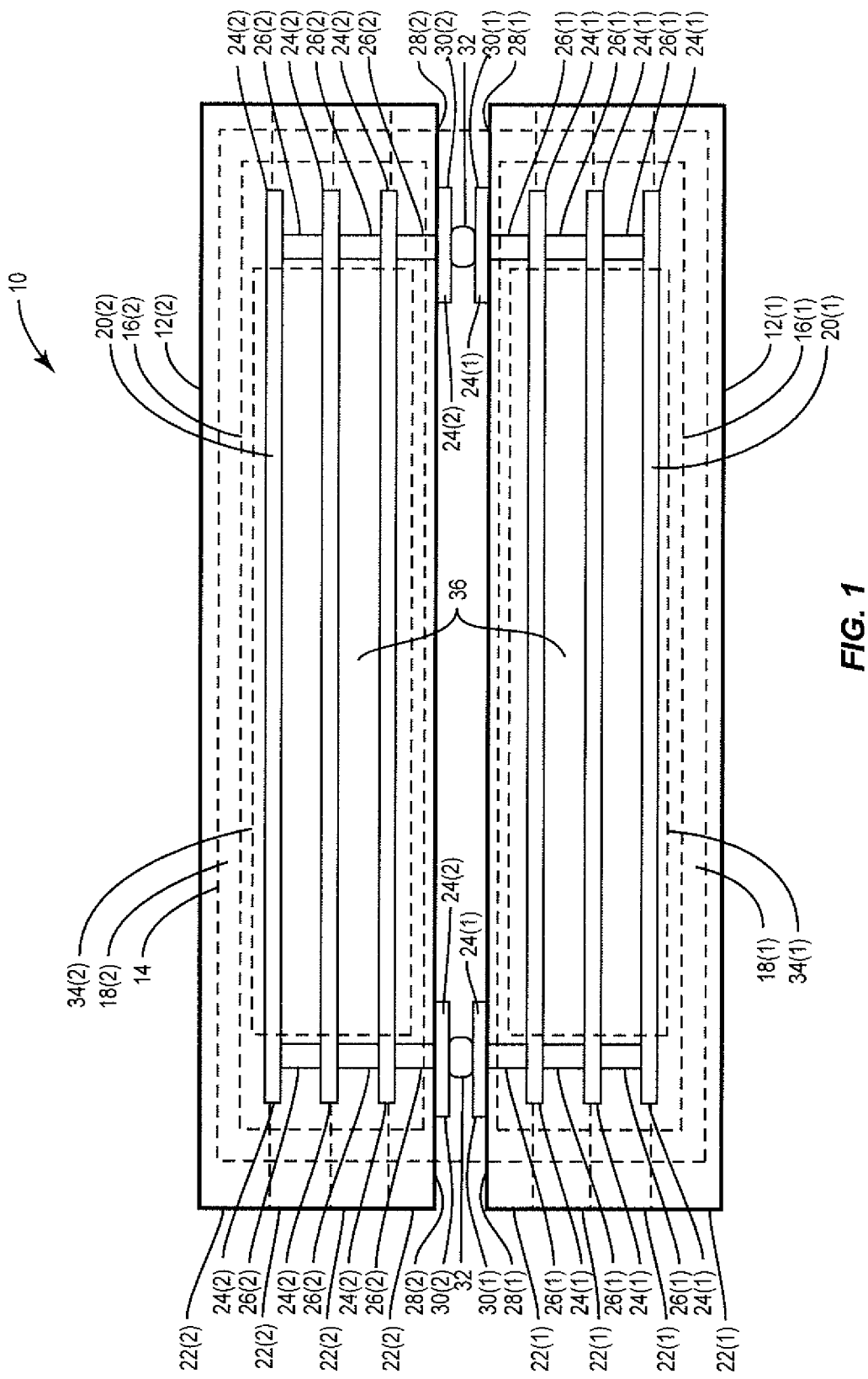
FIG. 1 illustrates an exemplary electronic device that includes a first substrate with a first inductor portion and a second substrate with a second inductor portion wherein the second substrate is mounted over the first substrate so that the second inductor portion and the first inductor portion form a three dimensional (3D) inductor.

FIG. 1 illustrates one embodiment of an electronic device 10 manufactured in accordance with this disclosure. The electronic device 10 is formed using a first substrate 12(1) and a second substrate 12(2). The electronic device 10 includes one embodiment of a 3D inductor 14 that is integrated into the first substrate 12(1) and the second substrate 12(2). More specifically, the 3D inductor 14 includes a first inductor portion 16(1) that is integrated into the first substrate 12(1) and a second inductor portion 16(2) that is integrated into the second substrate 12(2). The second substrate 12(2) is mounted onto the first substrate 12(1) such that the first inductor portion 16(1) is electrically connected to the second inductor portion 16(2). Furthermore, the second inductor portion 16(2) is positioned over the first inductor portion 16(1) such that the first inductor portion 16(1) and the second inductor portion 16(2) form the 3D inductor 14. As such, the first inductor portion 16(1) integrated into the first substrate 12(1) and the second inductor portion 16(2) integrated into the second substrate 12(2) form a 3D current path of the 3D inductor 14.

With regard to the first substrate 12(1), the first substrate 12(1) has a first substrate body 18(1) and a first conductive structure 20(1) that is integrated into the first substrate body 18(1). The first inductor portion 16(1) of the 3D inductor 14 is formed as part of the first conductive structure 20(1) on and within the first substrate body 18(1). The first substrate body 18(1) is made from suitable non-conductive material(s) and/or semiconductor material(s). Exemplary non-conductive materials include laminate, glass, a dielectric, plastic, fiber, and/or the like. Exemplary semiconductor materials include Silicon (Si), Silicon Germanium (SiGe), Gallium Arsenide (GaAs), Indium Phosphorus (InP), and/or the like. The first substrate body 18(1) of the first substrate 12(1) may also be single layered or multi-layered. First laminated substrate layers 22(1) may be formed from laminates such as FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. The first laminated substrate layers 22(1) are stacked on each other to form the first substrate body 18(1). In this embodiment, the first substrate body 18(1) is formed from an integer number N of the first laminated substrate layers 22(1). Different embodiments of the first substrate body 18(1) may be formed so that the integer number N is greater or equal to two.

With regard to the first conductive structure 20(1) of the first substrate 12(1), the first conductive structure 20(1) is integrated into the first substrate body 18(1). The first conductive structure 20(1) may be formed on and/or within the first substrate body 18(1) using any type of suitable conductive material(s). These conductive materials may be made from any type of metal(s) including, for example, copper (Cu), gold (Au), silver (Ag), Nickel (Ni), metallic alloys, and/or the like. In this embodiment, the first substrate 12(1) is a multi-layered substrate, and the first substrate body 18(1) is made from a laminate. Additionally, conductive materials may also be non-metallic conductive materials (e.g., graphene). The first substrate 12(1) thus includes the first substrate body 18(1), which is formed from a first plurality of laminated substrate layers (referred to also as first laminated substrate layers 22(1)). The first conductive structure 20(1) includes a first plurality of metallic layers (referred to generally as first metallic layers 24(1)), which in this embodiment are stacked over one another, and a first plurality of conductive vias (referred to generally as first conductive vias 26(1)) that are between and directly attached to the first metallic layers 24(1). The first metallic layers 24(1) are stacked over one another with one of the first laminated substrate layers 22(1) sandwiched in between adjacent pairs of the first metallic layers 24(1). The first conductive vias 26(1) provide an electrical connection between the first metallic layers 24(1). In the alternative, the first conductive vias 26 may not be directly attached to the first metallic layers 24(1) and may indirectly connect to the first metallic layers 24(1). In this case, the first conductive vias 26(1) may be electrically connected to the first metallic layers 24(1) by other structures within the first conductive structure 20(1). In yet another alternative embodiment, the first conductive vias 26(1) may be directly connected to one another without the use of the first metallic layers 24(1).

At least some of the first metallic layers 24(1) are formed within the first substrate body 18(1). The first metallic layers 24(1) within the first substrate body 18(1) are provided between different adjacent pairs of the first laminated substrate layers 22(1). One or more of the first metallic layers 24(1) may also be formed on a surface of the first substrate body 18(1). In this embodiment, the first conductive structure 20(1) is formed from an integer number Y of the first laminated substrate layers 22(1). The integer number Y of the first metallic layers 24(1) is related to the integer number N of the first laminated substrate layers 22(1) since the at least some of the first metallic layers 24(1) are formed within the first substrate body 18(1) between different adjacent pairs of the first laminated substrate layers 22(1).

Furthermore, at least some of the first conductive vias 26(1) are formed within the first substrate body 18(1). In this embodiment, each of the first conductive vias 26(1) is formed to extend vertically through a corresponding one of the first laminated substrate layers 22(1). At least some of the first conductive vias 26(1) are formed within the first substrate body 18(1). As such, these first conductive vias 26(1) connect different corresponding pairs of the first metallic layers 24(1) adjacent to the corresponding one of the first laminated substrate layers 22(1). One or more of the first conductive vias 26(1) may also be formed to connect conductive components on a surface of the first substrate body 18(1). In this embodiment, the first conductive structure 20(1) is formed from an integer number Z of the first conductive vias 26(1). The integer number Z of the first conductive vias 26(1) is related to the integer number N of the first laminated substrate layers 22(1) since the first conductive vias 26(1) are formed to extend vertically through its corresponding first laminated substrate layers 22(1).

With regard to the second substrate 12(2), the second substrate 12(2) has a second substrate body 18(2) and a second conductive structure 20(2) that is integrated into the second substrate body 18(2). The second inductor portion 16(2) of the 3D inductor 14 is formed as part of the second conductive structure 20(2) on and within the second substrate body 18(2). The second substrate body 18(2) is made from suitable non-conductive material(s) and/or semiconductor material(s). Exemplary non-conductive materials include laminate, glass, a dielectric, plastic, fiber, and/or the like. Exemplary semiconductor materials include Silicon (Si), Silicon Germanium (SiGe), Gallium Arsenide (GaAs), Indium Phosphorus (InP), and/or the like. The second substrate body 18(2) of the second substrate 12(2) may also be single layered or multi-layered. The second laminated substrate layers 22(2) may be formed from laminates such as FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. The second laminated substrate layers 22(2) are stacked on each other to form the second substrate body 18(2). In this embodiment, the second substrate body 18(2) is formed from an integer number M of the second laminated substrate layers 22(2). Different embodiments of the second substrate body 18(2) may be formed so that the integer number M is greater or equal to two. As explained in further detail below, the integer number N of the first laminated substrate layers 22(1) and the integer number M of the second laminated substrate layers 22(1) may be the same or different.

With regard to the second conductive structure 20(2) of the second substrate 12(2), the second conductive structure 20(2) is integrated into the second substrate body 18(2). The second conductive structure 20(2) may be formed on and/or within the second substrate body 18(2) using any type of suitable conductive material(s). These conductive materials may be made from any type of metal(s) including, for example, copper (Cu), gold (Au), silver (Ag), Nickel (Ni), metallic alloys, and/or the like. In this embodiment, the second substrate 12(2) is a multi-layered substrate, and the second substrate body 18(2) is made from a laminate. Additionally, conductive materials may also be non-metallic conductive materials (e.g., graphene). The second multi-layered substrate 12(2) thus includes the second substrate body 18(2), which is formed from a second plurality of laminated substrate layers (referred to also as second laminated substrate layers 22(2)). The second conductive structure 20(2) includes a second plurality of metallic layers (referred to generally as second metallic layers 24(2)), which in this embodiment are stacked over one another and a second plurality of conductive vias (referred to generally as second conductive vias 26(2)) that are between and directly attached to the second metallic layers 24(2). The second conductive vias 26(2) provide an electrical connection to one another through their attachment to the second metallic layers 24(2). The second metallic layers 24(2) are stacked over one another with one of the second laminated substrate layers 22(2) sandwiched in between adjacent pairs of the second metallic layers 24(2). The second conductive vias 26(2) provide an electrical connection between the second metallic layers 24(2). In the alternative, the second conductive vias 26 may not be directly attached to the second metallic layers 24(2) and may indirectly connect to the second metallic layers 24(2). In this case, the second conductive vias 26(2) may be electrically connected to the second metallic layers 24(2) by other structures within the second conductive structure 20(2). In yet another alternative embodiment, the second conductive vias 26(2) may be directly connected to one another without the use of the second metallic layers 24(2).

At least some of the second metallic layers 24(2) are formed within the second substrate body 18(2). The second metallic layers 24(2) within the second substrate body 18(2) are provided between different adjacent pairs of the second laminated substrate layers 22(2). One or more of the second metallic layers 24(2) may also be formed on a surface of the second substrate body 18(2). In this embodiment, the second conductive structure 20(2) is formed from an integer number W of the second laminated substrate layers 22(2). The integer number W of the second metallic layers 24(2) is related to the integer number M of the second laminated substrate layers 22(2) since the at least some of the second metallic layers 24(2) are formed within the second substrate body 18(2) between different adjacent pairs of the second laminated substrate layers 22(2).

Furthermore, at least some of the second conductive vias 26(2) are formed within the second substrate body 18(2). In this embodiment, each of the second conductive vias 26(2) is formed to extend vertically through a corresponding one of the second laminated substrate layers 22(2). At least some of the second conductive vias 26(2) are formed within the second substrate body 18(2). As such, these second conductive vias 26(2) connect different corresponding pairs of the second metallic layers 24(2) adjacent to the corresponding one of the second laminated substrate layers 22(2). One or more of the second conductive vias 26(2) may also be formed to connect conductive components on a surface of the second substrate body 18(2). In this embodiment, the second conductive structure 20(2) is formed from an integer number X of the second conductive vias 26(2). The integer number X of the second conductive vias 26(2) is related to the integer number M of the second laminated substrate layers 22(2) since the second conductive vias 26(2) are formed to extend vertically through its corresponding second laminated substrate layers 22(2).

With regard to the first conductive structure 20(1) of the first substrate 12(1), the first conductive structure 20(1) forms the first inductor portion 16(1) which is integrated into the first substrate body 18(1). Furthermore, first substrate body 18(1) has a first surface 28(1) and the first inductor portion 16(1) includes first surface conductive pads 30(1) that are formed on the first surface 28(1) of the first substrate 12(1). As shown in FIG. 1, the first surface conductive pads 30(1) that are connected to the remainder of the first inductor portion 16(1) are electrically connected to the second inductor portion 16(2) integrated into the second substrate body 18(2). In this embodiment, the first surface conductive pads 30(1) are connected to the second inductor portion 16(2) with conductive connection components 32.

With regard to the second conductive structure 20(2) of the second substrate 12(2), the second conductive structure 20(2) forms the second inductor portion 16(2) which is integrated into the second substrate body 18(2). Furthermore, second substrate body 18(2) has a second surface 28(2) and the second inductor portion 16(2) includes second surface conductive pads 30(2) that are formed on the second surface 28(2) of the second substrate 12(2). As shown in FIG. 1, the second surface conductive pads 30(2) that are connected to the remainder of the second inductor portion 16(2) are electrically connected to the first inductor portion 16(1) integrated into the first substrate body 18(1). In this embodiment, the second surface conductive pads 30(2) are connected to the first inductor portion 16(1) with the conductive connection components 32.

The second substrate 12(2) is mounted over the first substrate 12(1) such that the second surface 28(2) faces the first surface 28(1) of the first substrate 12(1). The second inductor portion 16(2) is positioned within the second substrate 12(2) such that the second inductor portion 16(2) is positioned directly over the first inductor portion 16(1). The first inductor portion 16(1) is 3D so as to encompass a 3D volume 34(1) within the first substrate body 18(1) and the second inductor portion 16(2) is 3D so as to encompass a 3D volume 34(2) within the second substrate body 18(2). Since the second inductor portion 16(2) is positioned directly over the first inductor portion 16(1), the second inductor portion 16(2) and the first inductor portion 16(1) are aligned so that the 3D volume 34(1) and the 3D volume 34(2) define a 3D volume 36 of the 3D inductor 14. The 3D volume 36 is in the interior of the 3D inductor 14 and includes the 3D volume 34(1) of the first substrate body 18(1) of the first substrate 12(1) and the 3D volume 34(2) of the second substrate body 18(2) of the second substrate 12(2).

Figure 1A:
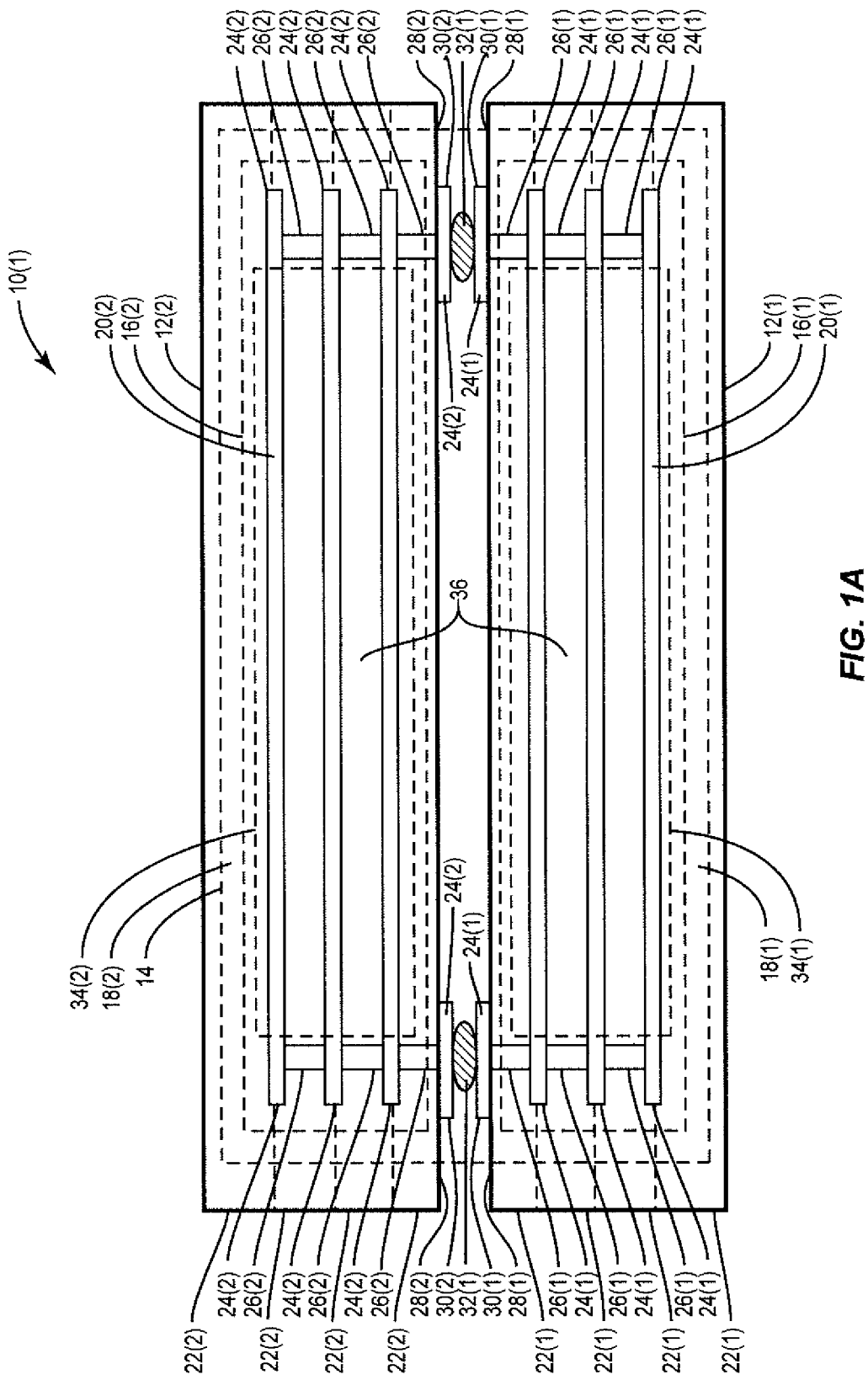
FIG. 1A illustrates an exemplary embodiment of the electronic device shown in FIG. 1 where solder balls are used to electrically connect the first inductor portion and the second inductor portion.

FIG. 1A illustrates an embodiment of the electronic device 10(1), which is an exemplary embodiment of the electronic device 10 shown in FIG. 1. The electronic device 10(1) is the same as the electronic device 10 shown in FIG. 1. However, the electronic device 10(1) shown in FIG. 1A has solder balls 32(1) to connect the first inductor portion 16(1) to the second inductor portion 16(2) where the solder balls 32(1) are a specific embodiment of the conductive connection components 32 shown in FIG. 1. The solder balls 32(1) are provided as a finish on the surface conductive pads 30(2). Once the second substrate 12(2) is mounted on the first substrate 12(1) so that the solder balls 32(1) on the surface conductive pads 30(2) make contact with the surface conductive pads 30(1), the solder balls 32(1) are heated. Once the solder balls 32(1) cool, the solder balls 32(1) attach the surface conductive pads 30(2) to the surface conductive pads 30(1). The solder balls 32(1) are conductive and thus also electrically connect the first inductor portion 16(1) to the second inductor portion 16(2).

Figure 1B:
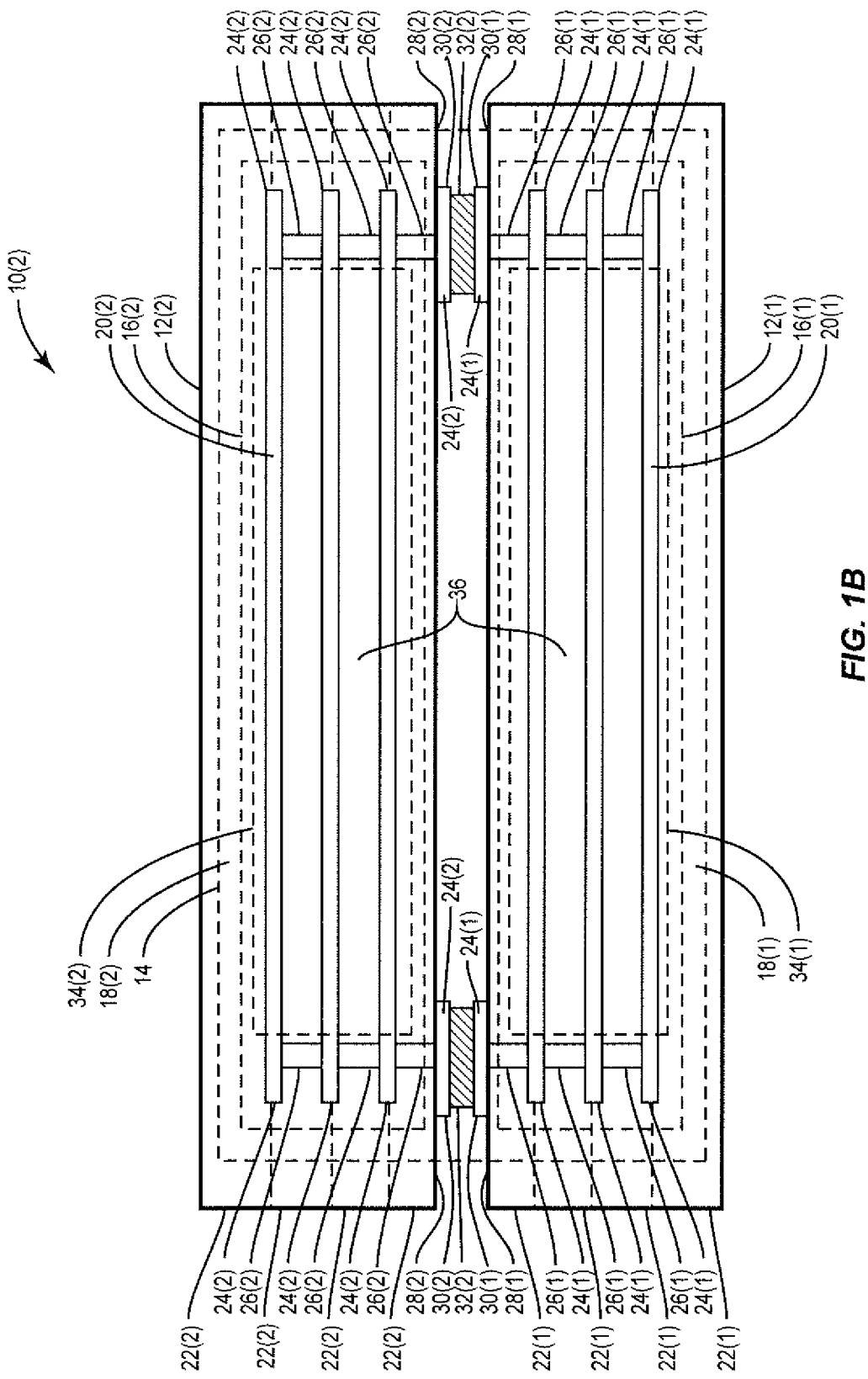
FIG. 1B illustrates an exemplary embodiment of the electronic device shown in FIG. 1 where direct solder is used to electrically connect the first inductor portion and the second inductor portion.
Figure 1C:
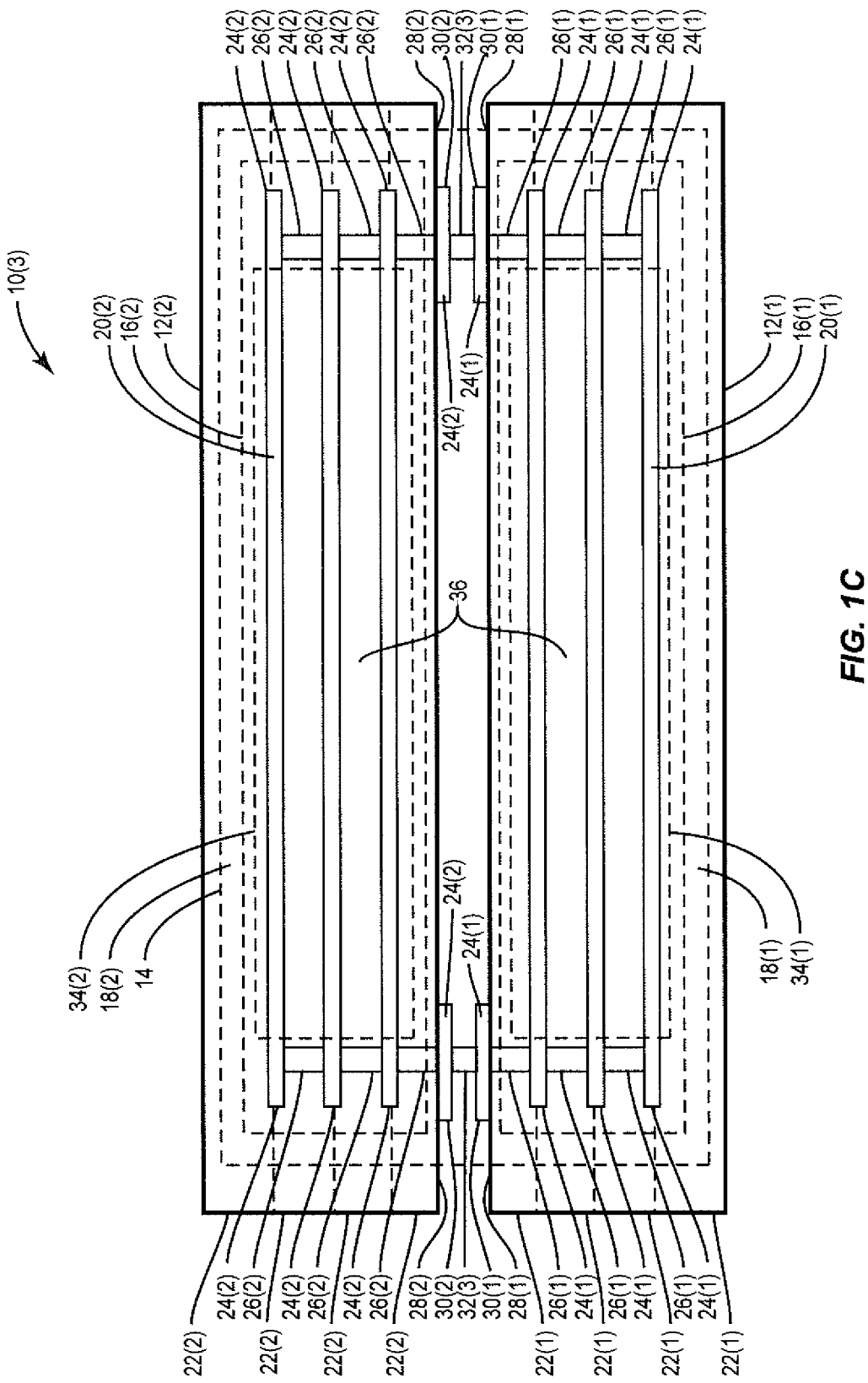
FIG. 1C illustrates an exemplary embodiment of the electronic device shown in FIG. 1 where copper pillars are used to electrically connect the first inductor portion and the second inductor portion.

FIG. 1B illustrates another embodiment of the electronic device 10(2), which is an exemplary embodiment of the electronic device 10 shown in FIG. 1. The electronic device 10(2) is the same as the electronic device 10 shown in FIG. 1. However, the electronic device 10(2) shown in FIG. 1B has direct solder 32(2) to connect the first inductor portion 16(1) to the second inductor portion 16(2) where the direct solder 32(2) is a specific embodiment of the conductive connection components 32 shown in FIG. 1. The direct solder 32(2) is provided post fabrication where solder paste is applied manually between the surface conductive pads 30(2) and the surface conductive pads 30(1) once the second substrate 12(2) is mounted on the first substrate 12(1). The solder paste is heated and once the solder paste cool provide the direct solder 32(2) shown in FIG. 1B. The direct solder 32(2) attaches the surface conductive pads 30(2) to the surface conductive pads 30(1). The direct solder 32(2) are conductive and thus also electrically connect the first inductor portion 16(1) to the second inductor portion 16(2).

Figure 10:
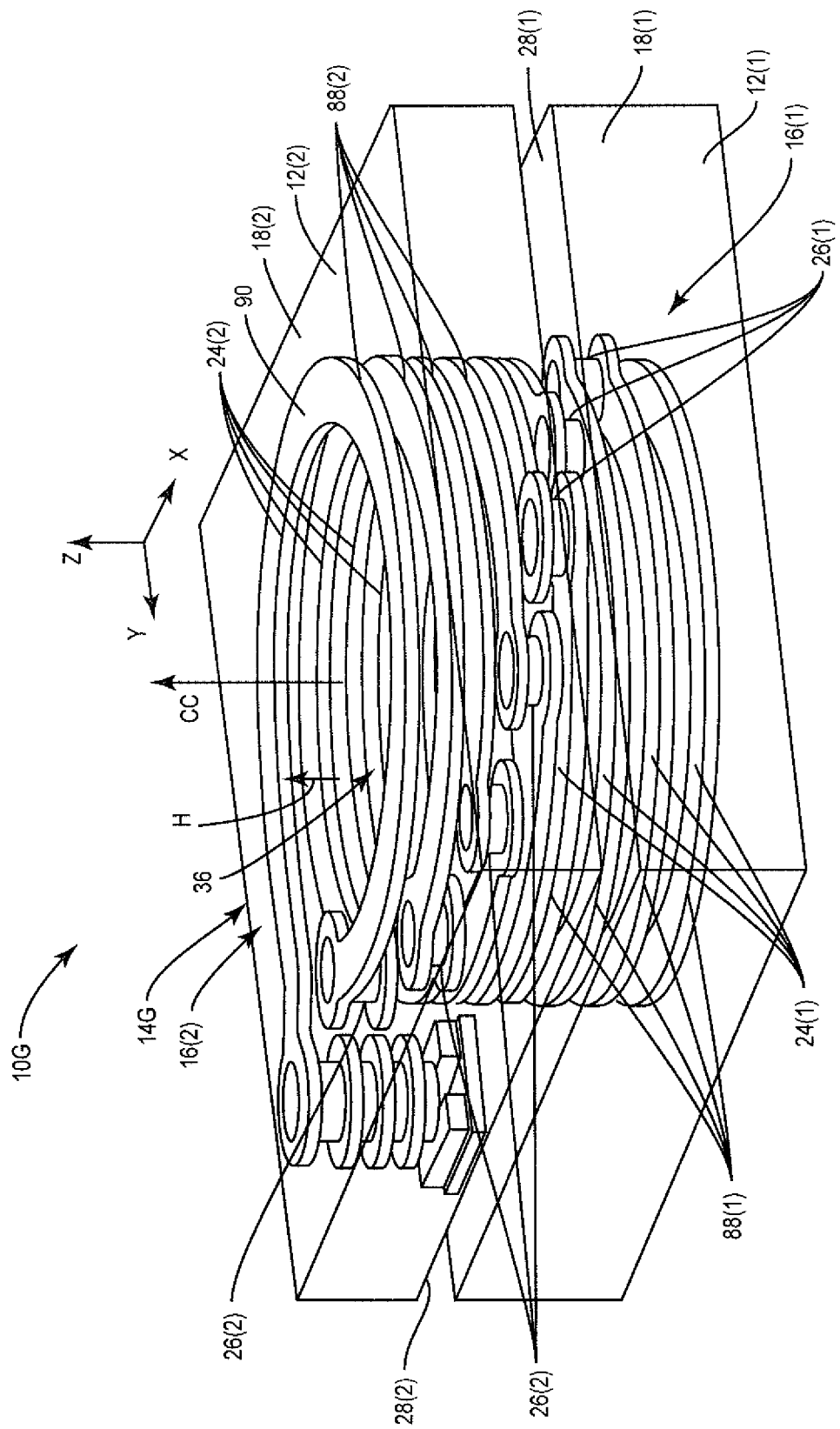
FIG. 10 illustrate one embodiment of the electronic device shown in FIG. 1 and formed with the first substrate shown in FIG. 9A and the second substrate shown in FIG. 9B.

FIG. 10 illustrates yet another embodiment of the electronic device 10(3), which is an exemplary embodiment of the electronic device 10 shown in FIG. 1. The electronic device 10(3) is the same as the electronic device 10 shown in FIG. 1. However, the electronic device 10(3) shown in FIG. 10 has copper pillars 32(3) to connect the first inductor portion 16(1) to the second inductor portion 16(2) where the copper pillars 32(3) are a specific embodiment of the conductive connection components 32 shown in FIG. 1. The copper pillars 32(3) plated on the surface conductive pads 30(1) and the surface conductive pads 30(2) are plated on the copper pillars 32(3). The copper pillars 32(3) attach the surface conductive pads 30(2) to the surface conductive pads 30(1). The copper pillars 32(3) are conductive and thus also electrically connect the first inductor portion 16(1) to the second inductor portion 16(2).

Figure 1D:
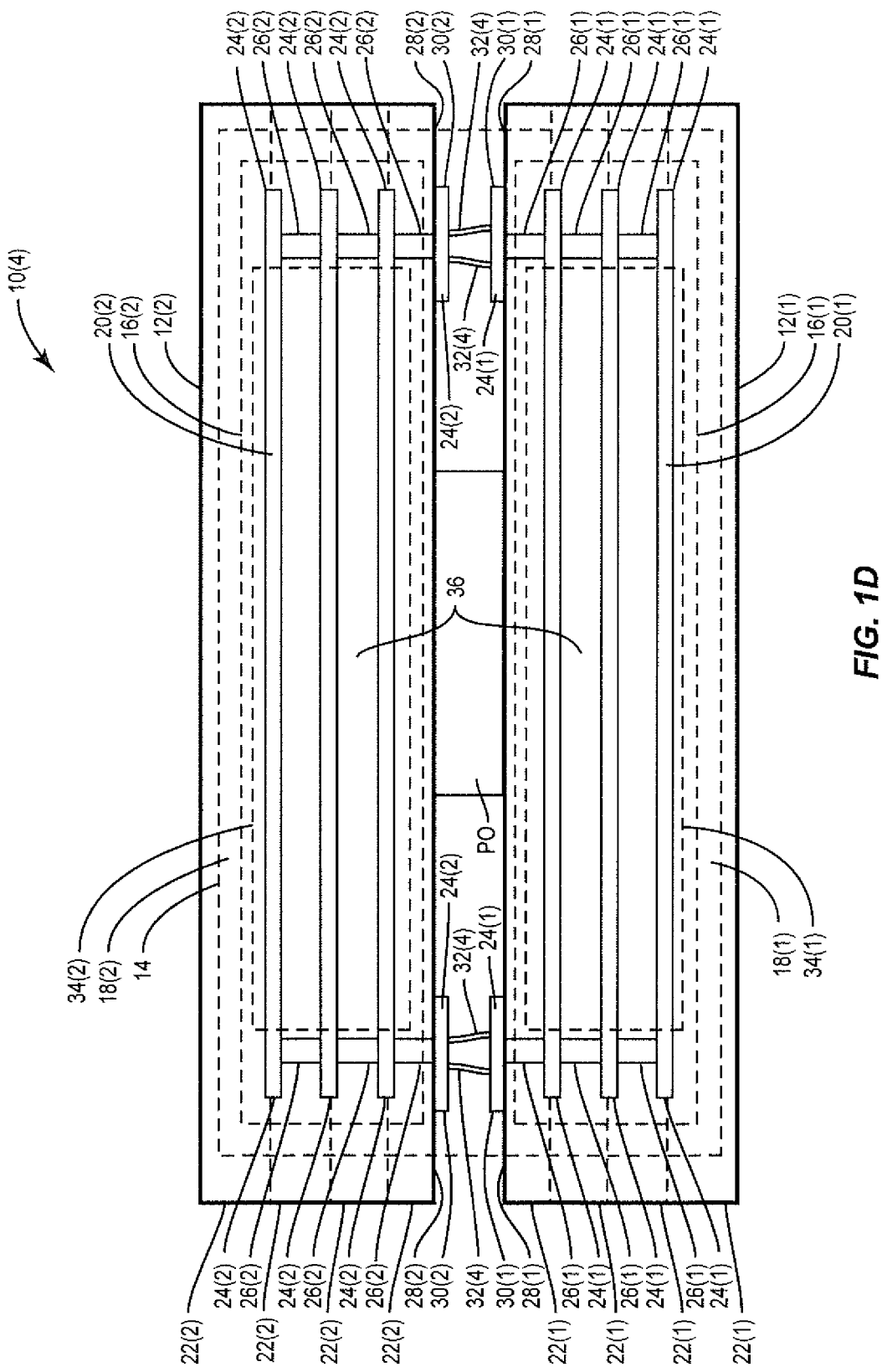
FIG. 1D illustrates an exemplary embodiment of the electronic device shown in FIG. 1 where wire bonds are used to electrically connect the first inductor portion and the second inductor portion.

FIG. 1D illustrates yet another embodiment of the electronic device 10(4), which is an exemplary embodiment of the electronic device 10 shown in FIG. 1. The electronic device 10(4) is the same as the electronic device 10 shown in FIG. 1. However, the electronic device 10(4) shown in FIG. 1D has wire bonds 32(4) to connect the first inductor portion 16(1) to the second inductor portion 16(2) where the wire bonds 32(4) are a specific embodiment of the conductive connection components 32 shown in FIG. 1. First, the wire bonds 32(4) are attached to the surface conductive pads 30(2) the second substrate 16(2). Next, the second substrate 16(2) is mounted on a post PO provided on the first substrate 16(1) so that the surface conductive pads 30(2) are directly over the surface conductive pads 30(1). The wire bonds 32(4) are then attached to the surface conductive pads 30(1). The wire bonds 32(4) are conductive and thus also electrically connect the first inductor portion 16(1) to the second inductor portion 16(2). The wire bonds 32(4) may be of any conductive material such as Cu and/or Au.

FIGS. 1A-1D thus illustrate different embodiments of the electronic device 10 shown in FIG. 1 where the embodiments of the electronic devices 10(1), 10(2), 10(3), 10(4) have different embodiments of the conductive connection components 32 to connect the first inductor portion 16(1) and the second inductor portion 16(2). It should be noted that the conductive connection components 32 described in FIGS. 1A-1D are exemplary and not exhaustive. Alternative conductive connection components 32 would be apparent to one of ordinary skill in the art and are within the scope of this disclosure.

Figure 2:
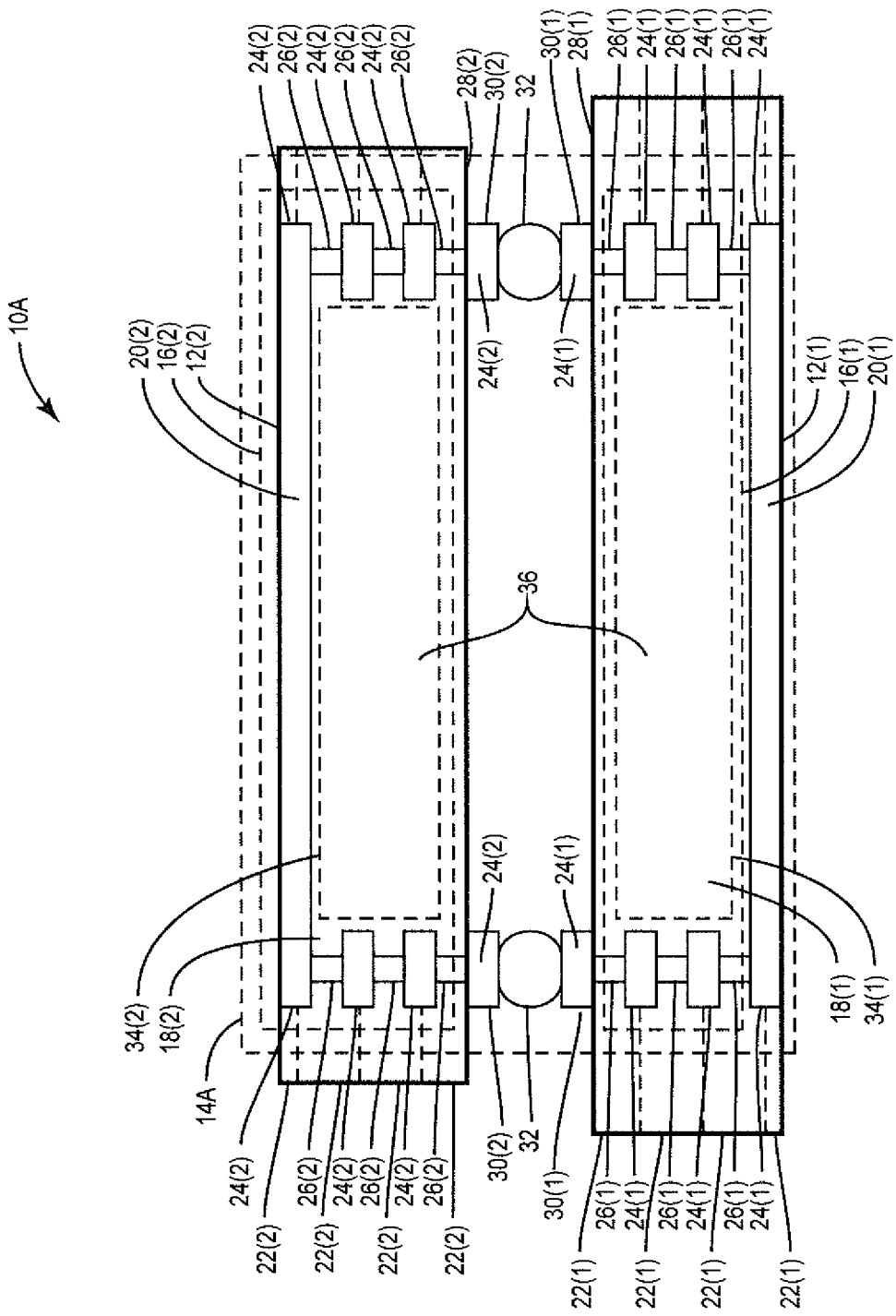
FIG. 2 illustrates one embodiment of the electronic device shown in FIG. 1 wherein the first substrate and the second substrate are of approximately equal thickness.

FIG. 2 illustrates another embodiment of the electronic device 10A, which is an exemplary embodiment of the electronic device 10 shown in FIG. 1. The electronic device 10A includes an exemplary 3D inductor 14A, which is one embodiment of the 3D inductor 14 shown in FIG. 1. In this embodiment, the first inductor portion 16(1) of the first substrate 12(1) and the second inductor portion 16(2) have the same thickness. Accordingly, the first laminated substrate layers 22(1) of the first substrate 12(1) and the second laminated substrate layers 22(2) of the second substrate 12(2) have the same number of layers. In other words, the integer number N of the first laminated substrate layers 22(1) of the first substrate 12(1) and the integer number M of the second laminated substrate layers 22(2) of the second substrate 12(2) are equal. Furthermore, the first conductive structure 20(1) and the second conductive structure 20(2) have the same number of first metallic layers 24(1) and second metallic layers 24(2) and also the same number of the first conductive vias 26(1) and second conductive vias 26(2). In other words, the integer number Y of the first metallic layers 24(1) of the first substrate 12(1) and the integer number W of the second metallic layers 24(2) of the second substrate 12(2) are equal. Additionally, the integer number Z of the first conductive vias 26(1) of the first substrate 12(1) and the integer number X of the second conductive vias 26(2) of the second substrate 12(2) are equal. The first substrate 12(1) thus has a first thickness and the second substrate 12(2) has a second thickness wherein the first thickness and the second thickness are substantially equal. Accordingly, the first inductor portion 16(1) of the first substrate 12(1) has a first height, and the second inductor portion 16(2) has a second height wherein the first height and the second height are the same.

Figure 3:
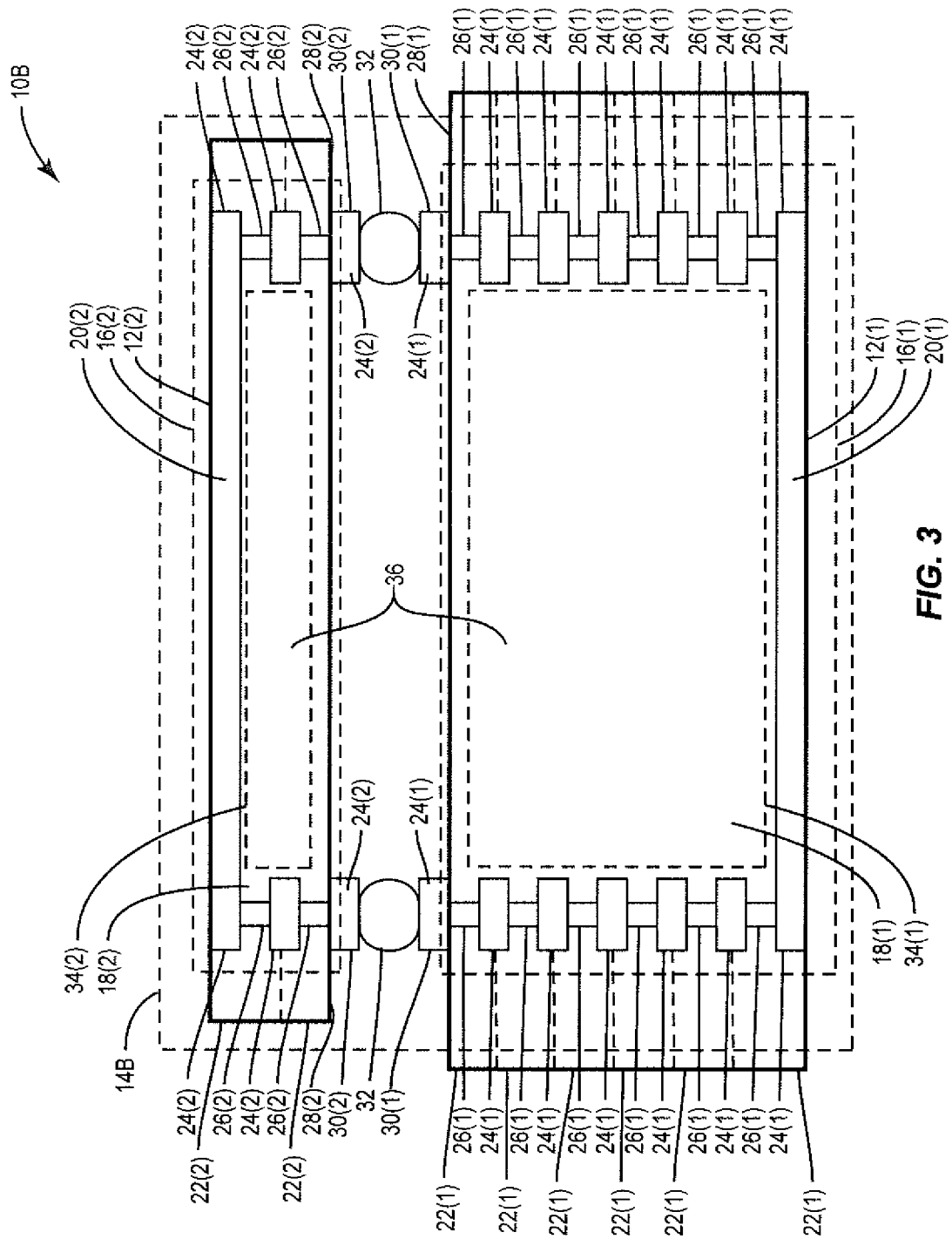
FIG. 3 illustrates one embodiment of the electronic device shown in FIG. 1 wherein the first substrate is thicker than the second substrate.
Figure 4:
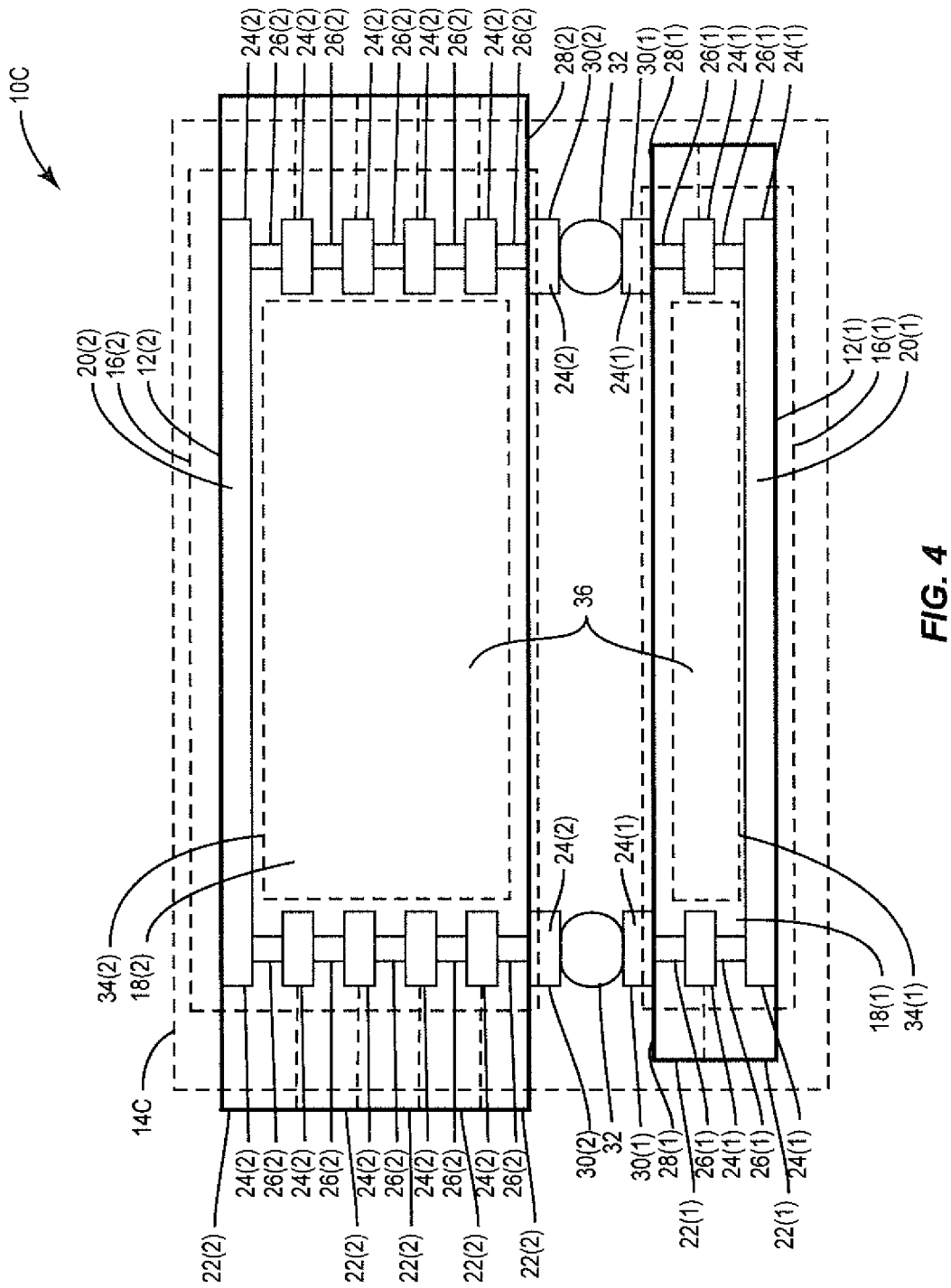
FIG. 4 illustrates one embodiment of the electronic device shown in FIG. 1 wherein the second substrate is thicker than the first substrate.

FIG. 3 illustrates another embodiment of the electronic device 10B, which is an exemplary embodiment of the electronic device 10 shown in FIG. 1. The electronic device 10B includes an exemplary 3D inductor 14B, which is one embodiment of the 3D inductor 14 shown in FIG. 1. In this embodiment, the second inductor portion 16(2) of the second substrate 12(2) is thinner than the first inductor portion 16(1) of the first substrate 12(1). As such, the number of first laminated substrate layers 22(1) of the first substrate 12(1) is greater than the number of the second laminated substrate layers 22(2) in the second substrate 12(2). In other words, the integer number N of the first laminated substrate layers 22(1) of the first substrate 12(1) is greater than the integer number M of the second laminated substrate layers 22(2) of the second substrate 12(2). Furthermore, the first conductive structure 20(1) has a greater number of the first metallic layers 24(1) than the second metallic layers 24(2) of the second conductive structure 20(2) and also has a greater number of the first conductive vias 26(1) than the second conductive vias 26(2) of the second conductive structure 20(2). In other words, the integer number Y of the first metallic layers 24(1) of the first substrate 12(1) is greater than the integer number W of the second metallic layers 24(2) of the second substrate 12(2). Additionally, the integer number Z of the first conductive vias 26(1) of the first substrate 12(1) is greater than the integer number X of the second conductive vias 26(2) of the second substrate 12(2). Accordingly, the first inductor portion 16(1) of the first substrate 12(1) has a first height, and the second inductor portion 16(2) has a second height wherein the first height is greater than the second height. The first substrate 12(1) is thus has a first thickness, and the second substrate 12(2) has a second thickness wherein the first thickness is greater than the second thickness FIG. 4 illustrates another embodiment of the electronic device 10C, which is an exemplary embodiment of the electronic device 10 shown in FIG. 1. The electronic device 10C includes an exemplary 3D inductor 14C, which is one embodiment of the 3D inductor 14 shown in FIG. 1. In this embodiment, the second inductor portion 16(2) of the second substrate 12(2) is greater than the first inductor portion 16(1) of the first substrate 12(1). As such, the number of the first laminated substrate layers 22(1) of the first substrate 12(1) is greater than the number of second laminated substrate layers 22(2) in the second substrate 12(2). In other words, the integer number N of the first laminated substrate layers 22(1) of the first substrate 12(1) is less than the integer number M of the second laminated substrate layers 22(2) of the second substrate 12(2). Furthermore, the first conductive structure 20(1) has fewer of the first metallic layers 24(1) than the second conductive structure 20(2) has second metallic layers 24(2) and also has fewer of the first conductive vias 26(1) than the second conductive structure 20(2) has second conductive vias 26(2). In other words, the integer number Y of the first metallic layers 24(1) of the first substrate 12(1) is less than the integer number W of the second metallic layers 24(2) of the second substrate 12(2). Additionally, the integer number Z of the first conductive vias 26(1) of the first substrate 12(1) is less than the integer number X of the second conductive vias 26(2) of the second substrate 12(2). Accordingly, the first inductor portion 16(1) of the first substrate 12(1) has a first height, and the second inductor portion 16(2) has a second height wherein the first height is less than the second height. The first substrate 12(1) thus has a first thickness and the second substrate 12(2) has a second thickness wherein the second thickness is greater than the first thickness.

Referring now to FIGS. 2-4, FIGS. 2-4 thus illustrate different embodiments of the electronic device 10 shown in FIG. 1 where the embodiments of the electronic devices 10A, 10B, 10C have the first substrate 12(1) and the second substrate 12(2) with different relative sizes. This allows for the 3D inductor 14 to be formed with a desired size despite restrictions on the size of one of the substrates 12(1), 12(2). For example, the first substrate 12(1) may be a package substrate and thus be restricted with regards to the integer number N of the first laminated substrate layers 22(1), the integer number Y of the first metallic layers 24(1), and the integer number Z of the first conductive vias 26(1). However, the integer number N of the first laminated substrate layers 22(1), the integer number Y of the first metallic layers 24(1), and the integer number Z of the first conductive vias 26(1) may be insufficient to provide the 3D inductor 14 with the height to provide a desired quality (Q) factor. Thus, the second substrate 12(2) is mounted onto the first substrate 12(1) such that the first inductor portion 16(1) is electrically connected to the second inductor portion 16(2). In this manner, the second substrate 12(2) can provide the additional second metallic layers 24(2) so that the 3D inductor 14 has a greater Q factor while still providing the first substrate 12(1) with the restricted integer number N of the first laminated substrate layers 22(1), the integer number Y of the first metallic layers 24(1), and the integer number Z of the first conductive vias 26(1). The first surface conductive pads 30(1) and the second surface conductive pads 30(2) in FIGS. 2-4 are connected with the conductive connection components 32, which may be provided in accordance with any of the embodiments described above in FIGS. 1A-1D or any combination thereof.

Figure 5:
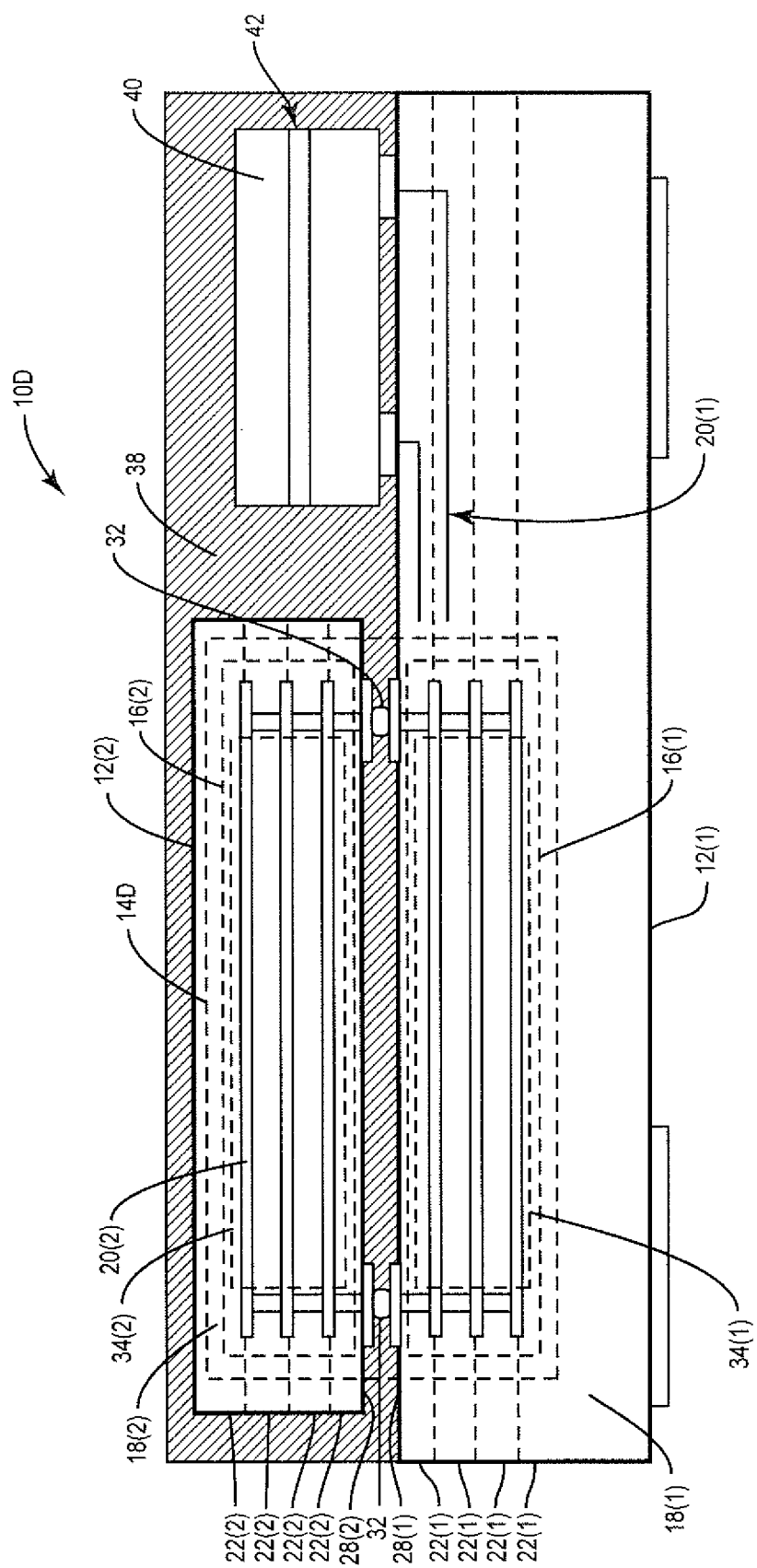
FIG. 5 illustrates one embodiment of the electronic device shown in FIG. 1 wherein the electronic device is an integrated circuit (IC) package having an overmold that covers the second substrate.

FIG. 5 illustrates another embodiment of the electronic device 10D, which is an exemplary embodiment of the electronic device 10 shown in FIG. 1. In this embodiment, the electronic device 10D is an integrated circuit (IC) package. The electronic device 10D includes the exemplary 3D inductor 14D, the embodiment of the 3D inductor 14 shown in FIG. 1. In this embodiment, the first substrate 12(1) is a package laminate of the electronic device 10D (i.e., the IC package) and the second substrate 12(2) is an auxiliary laminate that is mounted on the first substrate 12(1) (i.e., the package laminate). The electronic device 10D includes one embodiment of the 3D inductor 14 shown in FIG. 1 that is integrated into the first substrate 12(1) and the second substrate 12(2). More specifically, the 3D inductor 14D includes the first inductor portion 16(1) that is integrated into the first substrate 12(1) and the second inductor portion 16(2) that is integrated into the second substrate 12(2). The second substrate 12(2) is mounted onto the first substrate 12(1) such that the first inductor portion 16(1) is electrically connected to the second inductor portion 16(2). Furthermore, the second inductor portion 16(2) is positioned over the first inductor portion 16(1) such that the first inductor portion 16(1) and the second inductor portion 16(2)

form the 3D inductor 14D. As such, the first inductor portion 16(1) integrated into the first substrate 12(1) and the second inductor portion 16(2) integrated into the second substrate 12(2) form the 3D current path of the 3D inductor 14D.

In this embodiment, an overmold 38 is formed over first surface 28(1) of the first substrate so as to cover the second substrate 12(2) along with other electronic components mounted on the first substrate 12(1). The overmold 38 may be utilized to isolate the 3D inductor 14D and the other electronic components in the electronic device 10D (i.e., the IC package). The overmold 38 may include insulating or dielectric materials that prevent or substantially reduce both internal electromagnetic transmissions from the 3D inductor 14D and other electronic components and external electromagnetic transmissions generated outside of the electronic device 10D (i.e., the IC package).

In this embodiment, a semiconductor die 40 is housed by the electronic device 10D (i.e., the IC package). Surface mount device (SMDs) 42 are formed by the semiconductor die 40. For example, the SMDs 42 may include capacitive elements, such as programmable arrays of capacitors, varactors, metal-insulator-metal (MIM) capacitors, metal-oxide-metal (MOM) capacitors, and/or the like. The semiconductor die 40 is mounted on the first surface 28(1) of the first substrate 12(1) and is connected to the first conductive structure 20(1). In this embodiment, the first conductive structure 20(1) is formed to connect the semiconductor die 40 to the 3D inductor 14D. As such, the 3D inductor 14D and the SMDs 42 are connected by the electronic device 10D so as to form RF filtering components. It should be noted that the 3D inductor 14D of the electronic device 10D may have any one of the arrangements of the electronic devices 10A-10C described above with respect to FIGS. 2-4. Thus, the 3D inductor 14D can be provided with the first substrate 12(1) and the second substrate 12(2) having different relative sizes as described above with respect to FIGS. 2-4. Also, the first surface conductive pads 30(1) and the second surface conductive pads 30(2) in FIG. 5 are connected with the conductive connection components 32, which may be provided in accordance with any of the embodiments described above in FIGS. 1A-1D or any combination thereof.

Figure 6:
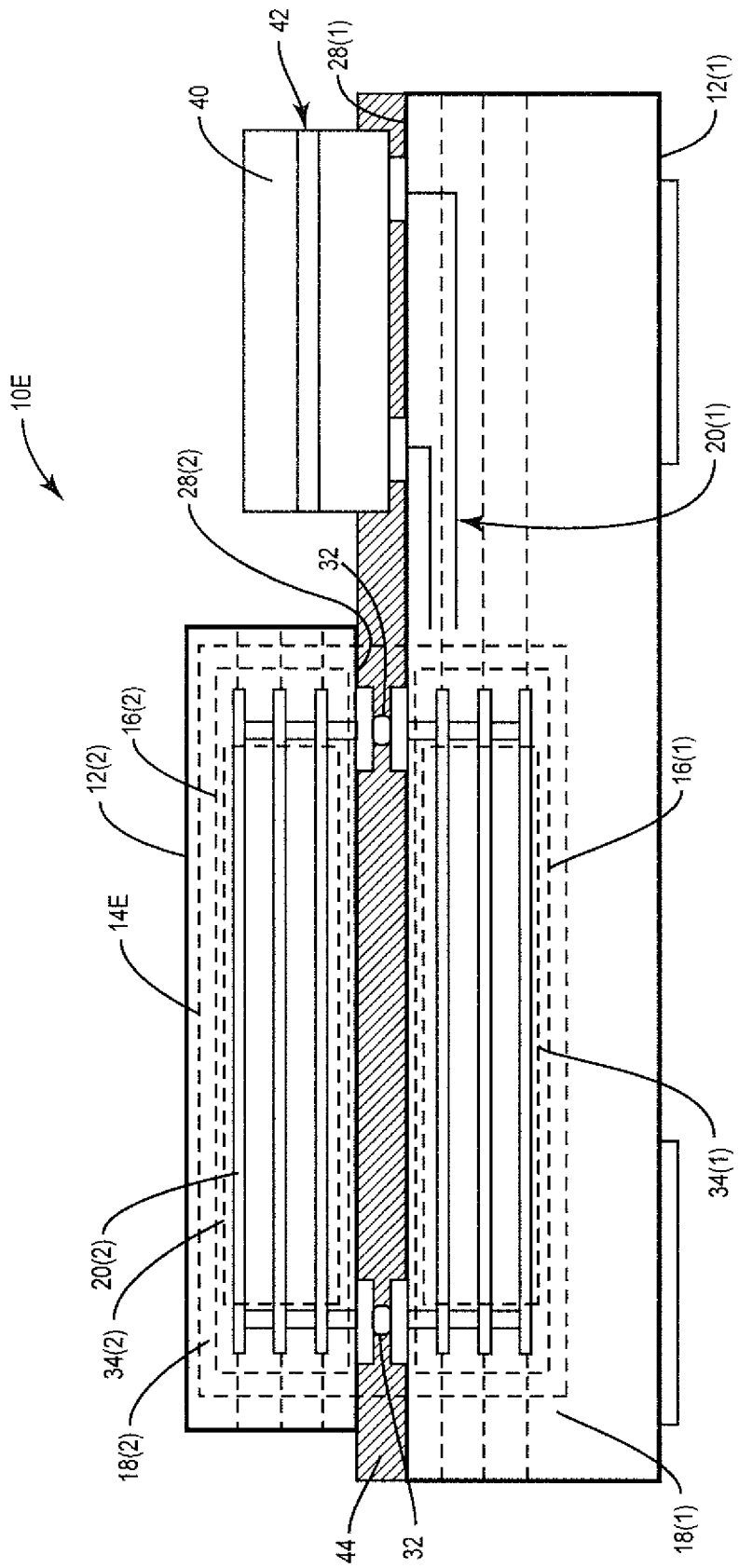
FIG. 6 illustrates one embodiment of the electronic device shown in FIG. 1 wherein the electronic device is another IC package having an undermold between the first substrate and the second substrate.

FIG. 6 illustrates another embodiment of the electronic device 10E, which is an exemplary embodiment of the electronic device 10 shown in FIG. 1. In this embodiment, the electronic device 10E is an integrated circuit (IC) package. The electronic device 10E includes the exemplary 3D inductor 14E, the embodiment of the 3D inductor 14 shown in FIG. 1. In this embodiment, the first substrate 12(1) is a package laminate of the electronic device 10E (i.e., the IC package), and the second substrate 12(2) is an auxiliary laminate that is mounted on the first substrate 12(1) (i.e., the package laminate). The electronic device 10E includes one embodiment of the 3D inductor 14 shown in FIG. 1 that is integrated into the first substrate 12(1) and the second substrate 12(2). More specifically, the 3D inductor 14E includes the first inductor portion 16(1) that is integrated into the first substrate 12(1) and the second inductor portion 16(2) that is integrated into the second substrate 12(2). The second substrate 12(2) is mounted onto the first substrate 12(1) such that the first inductor portion 16(1) is electrically connected to the second inductor portion 16(2). Furthermore, the second inductor portion 16(2) is positioned over the first inductor portion 16(1) such that the first inductor portion 16(1) and the second inductor portion 16(2) form the 3D inductor 14E. As such, the first inductor portion 16(1) integrated into the first substrate 12(1) and the second inductor portion 16(2) integrated into the second substrate 12(2) form the 3D current path of the 3D inductor 14E.

In this embodiment, an undermold 44 is formed over the first surface 28(1) of the first substrate body 18(1) and underneath the second substrate 12(2) and other electronic components mounted on the first substrate 12(1). As such, the undermold 44 is formed so as to cover the first surface 28(1) and the second surface 28(2). The undermold 44 may be utilized to isolate the 3D inductor 14E and the other electronic components in the electronic device 10E (i.e., the IC package). The undermold 44 may include insulating or dielectric materials that prevent or substantially reduce both internal electromagnetic transmissions from the 3D inductor 14E and other electronic components and external electromagnetic transmissions generated outside of the electronic device 10E (i.e., the IC package). By providing an undermold 44 instead of the overmold 38 shown in FIG. 5, a profile of the electronic device 10E is reduced. Nevertheless, the undermold 44 shown in FIG. 6 may not provide the isolation of the overmold 38 shown in FIG. 5.

Referring again to FIG. 6, the semiconductor die 40 described above with respect to FIG. 5 is housed by the electronic device 10E (i.e., the IC package). The SMDs 42 are formed by the semiconductor die 40 and may be include capacitive elements, such as programmable arrays of capacitors, varactors, MIM capacitors, MOM capacitors, and/or the like. The semiconductor die 40 is mounted on the first surface 28(1) of the first substrate 12(1) and is connected to the first conductive structure 20(1). In this embodiment, the first conductive structure 20(1) is formed to connect the semiconductor die 40 to the 3D inductor 14E. As such, the 3D inductor 14E and the SMDs 42 are connected by the electronic device 10E so as to form RF filtering components. It should be noted that the 3D inductor 14E of the electronic device 10E may have any one of the arrangements of the electronic devices 10A-10D described above with respect to FIGS. 2-5. Thus, the 3D inductor 14E can be provided with the first substrate 12(1) and the second substrate 12(2) having different relative sizes as described above with respect to FIGS. 2-4. Also, the first surface conductive pads 30(1) and the second surface conductive pads 30(2) in FIG. 6 are connected with the conductive connection components 32, which may be provided in accordance with any of the embodiments described above in FIGS. 1A-1D or any combination thereof.

Figure 7A:
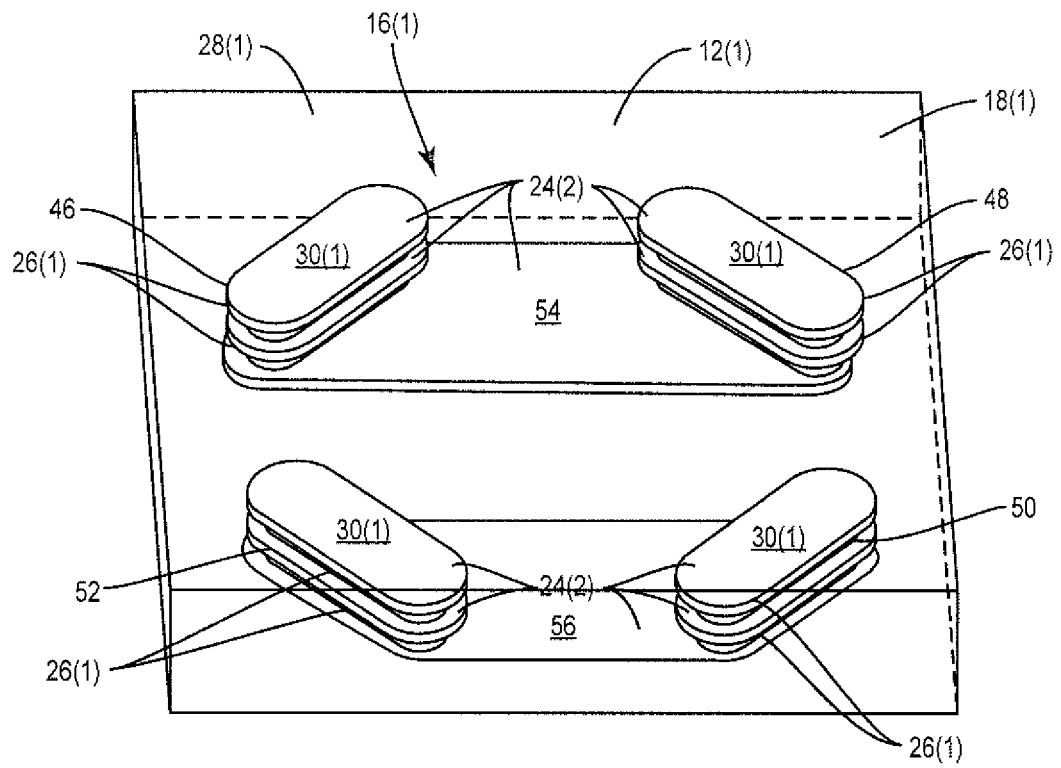
FIG. 7A illustrates one embodiment of the first substrate shown in FIG. 1 having stacks of conductive vias.
Figure 7B:
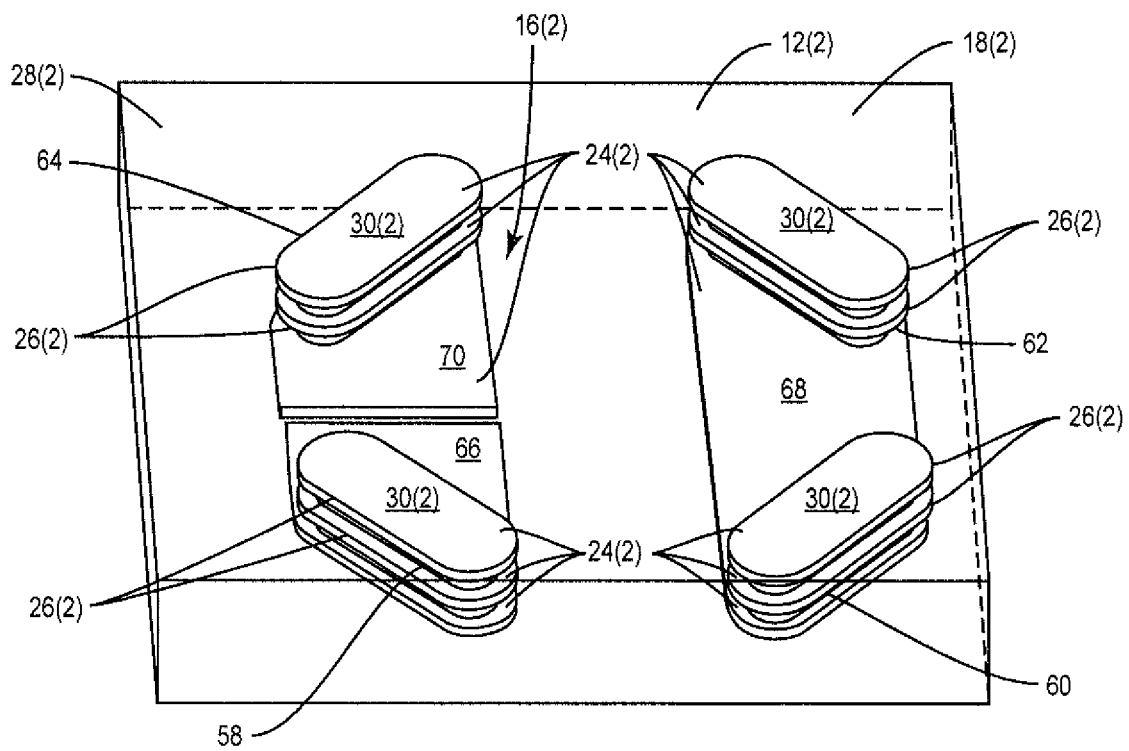
FIG. 7B illustrates one embodiment of the second substrate shown in FIG. 1 also having stacks of conductive vias.

Referring now to FIG. 7A and FIG. 7B, FIG. 7A and FIG. 7B illustrate embodiments of the first substrate 12(1) and the second substrate 12(2) utilized to form one embodiment of the 3D inductor 14 shown in FIG. 1. FIG. 7A illustrates one embodiment of the first substrate 12(1) where the first conductive structure 20(1) of the first substrate 12(1) includes one embodiment of the first inductor portion 16(1). FIG. 7B illustrates one embodiment of the second substrate 12(2) where the second conductive structure 20(2) of the second substrate 12(2) includes one embodiment of the second inductor portion 16(2). By mounting the second substrate 12(2) on the first substrate 12(1), the second inductor portion 16(2) is connected to the first inductor portion 16(1) so as to form one embodiment of the 3D inductor 14 shown in FIG. 1, as explained in further detail below.

Referring now specifically to FIG. 7A, the first inductor portion 16(1) shown in FIG. 7A includes a first stack 46 of the first conductive vias 26(1), a second stack 48 of the first conductive vias 26(1), a third stack 50 of the first conductive vias 26(1) and a fourth stack 52 of the first conductive vias 26(1). In this embodiment, the first conductive vias 26(1) are elongated vias as explained in further detail below. A connector plate 56 connects a connecting end of the first stack 46 of the first conductive vias 26(1) to a connecting end of the second stack 48 of the first conductive vias 26(1). Additionally, a connector plate 56 connects a connecting end of the third stack 50 of the first conductive vias 26(1) to a connecting end of the fourth stack 52 of the first conductive vias 26(1).

A mounting end of the first stack 46 of the first conductive vias 26(1) is provided by the first stack 46 of the first conductive vias 26(1) opposite the connection end, which is connected to a connector plate 54. The mounting end of the first stack 46 includes one embodiment of the first surface conductive pad 30(1) so that the first stack 46 of the first conductive vias 26(1) can be attached to the second inductor portion 16(2) with one of the conductive connection components. Furthermore, a mounting end of the second stack 48 of the first conductive vias 26(1) is provided by the second stack 48 of the first conductive vias 26(1) opposite the connection end, which is connected to the connector plate 54. The mounting end of the second stack 48 includes one embodiment of the first surface conductive pad 30(1) so that the second stack 48 of the first conductive vias 26(1) can also be attached to the second inductor portion 16(2) with one of the conductive connection components 32. Also, a mounting end of the third stack 50 of the first conductive vias 26(1) is provided by the third stack 50 of the first conductive vias 26(1) opposite the connection end, which is connected to the connector plate 56. The mounting end of the third stack 50 includes one embodiment of the first surface conductive pad 30(1) so that the third stack 50 of the first conductive vias 26(1) can also be attached to the second inductor portion 16(2) with one of the conductive connection components 32. Finally, a mounting end of the fourth stack 52 of the first conductive vias 26(1) is provided by the fourth stack 52 of the first conductive vias 26(1) opposite the connection end, which is connected to the connector plate 56. The mounting end of the fourth stack 52 includes one embodiment of the first surface conductive pad 30(1) so that the fourth stack 52 of the first conductive vias 26(1) can also be attached to the second inductor portion 16(2). In each stack 46, 48, 50, 52 of the first conductive vias 26(1), the first metallic layers 24(1) between the first conductive vias 26(1) form carrier pads. It should be noted that in alternative embodiments, the first metallic layers 24(1) and carrier pads may not be provided such that the first conductive vias 26(1) would be directly stacked on one another. The conductive connection components 32 may be provided in accordance with any of the embodiments described above in FIGS. 1A-1D or any combination thereof.

Referring now specifically to FIG. 7B, the second inductor portion 16(2) shown in FIG. 7B includes a first stack 58 of the second conductive vias 26(2), a second stack 60 of the second conductive vias 26(2), a third stack 62 of the second conductive vias 26(2) and a fourth stack 64 of the second conductive vias 26(2). In this embodiment, the second conductive vias 26(2) are elongated vias as explained in further detail below. A terminal plate 66 is connected to a connecting end of the first stack 58 of the second conductive vias 26(2). A connector plate 68 connects a connecting end of the second stack 60 of the second conductive vias 26(2) to a connecting end of the third stack 62 of the second conductive vias 26(2). Additionally, a terminal plate 70 is connected to a connecting end of the fourth stack 64 of the second conductive vias 26(2).

A mounting end of the first stack 58 of the second conductive vias 26(2) is provided by the first stack 58 of the second conductive vias 26(2) opposite the connection end, which is connected to the terminal plate 66. The mounting end of the first stack 58 includes one embodiment of the second surface conductive pad 30(2) so that the first stack 58 of the second conductive vias 26(2) can be attached to the first inductor portion 16(1) with one of the conductive connection components 32. Furthermore, a mounting end of the second stack 60 of the second conductive vias 26(2) is provided by the second stack 60 of the second conductive vias 26(2) opposite the connection end, which is connected to the connector plate 68. The mounting end of the second stack 60 includes one embodiment of the second surface conductive pad 30(2) so that the second stack 60 of the second conductive vias 26(2) can also be attached to the first inductor portion 16(1) with one of the conductive connection components 32. Also, a mounting end of the third stack 62 of the second conductive vias 26(2) is provided by the third stack 62 of the second conductive vias 26(2) opposite the connection end, which is connected to the connector plate 68. The mounting end of the third stack 62 includes one embodiment of the second surface conductive pad 30(2) so that the third stack 62 of the second conductive vias 26(2) can also be attached to the first inductor portion 16(1) with one of the conductive connection components 32. Finally, a mounting end of the fourth stack 64 of the second conductive vias 26(2) is provided by the fourth stack 64 of the second conductive vias 26(2) opposite the connection end, which is connected to the terminal plate 70. The mounting end of the fourth stack 64 includes one embodiment of the second surface conductive pad 30(2) so that the fourth stack 64 of the second conductive vias 26(2) can also be attached to the first inductor portion 16(1) with one of the conductive connection components 32. In each stack 58, 60, 62, 64 of the second conductive vias 26(2), the second metallic layers 24(2) between the second conductive vias 26(2) form carrier pads. It should be noted that in alternative embodiments, the second metallic layers 24(2) and carrier pads may not be provided such that the second conductive vias 26(2) would be directly stacked on one another. The conductive connection components 32 may be provided in accordance with any of the embodiments described above in FIGS. 1A-1D or any combination thereof.

Figure 8:
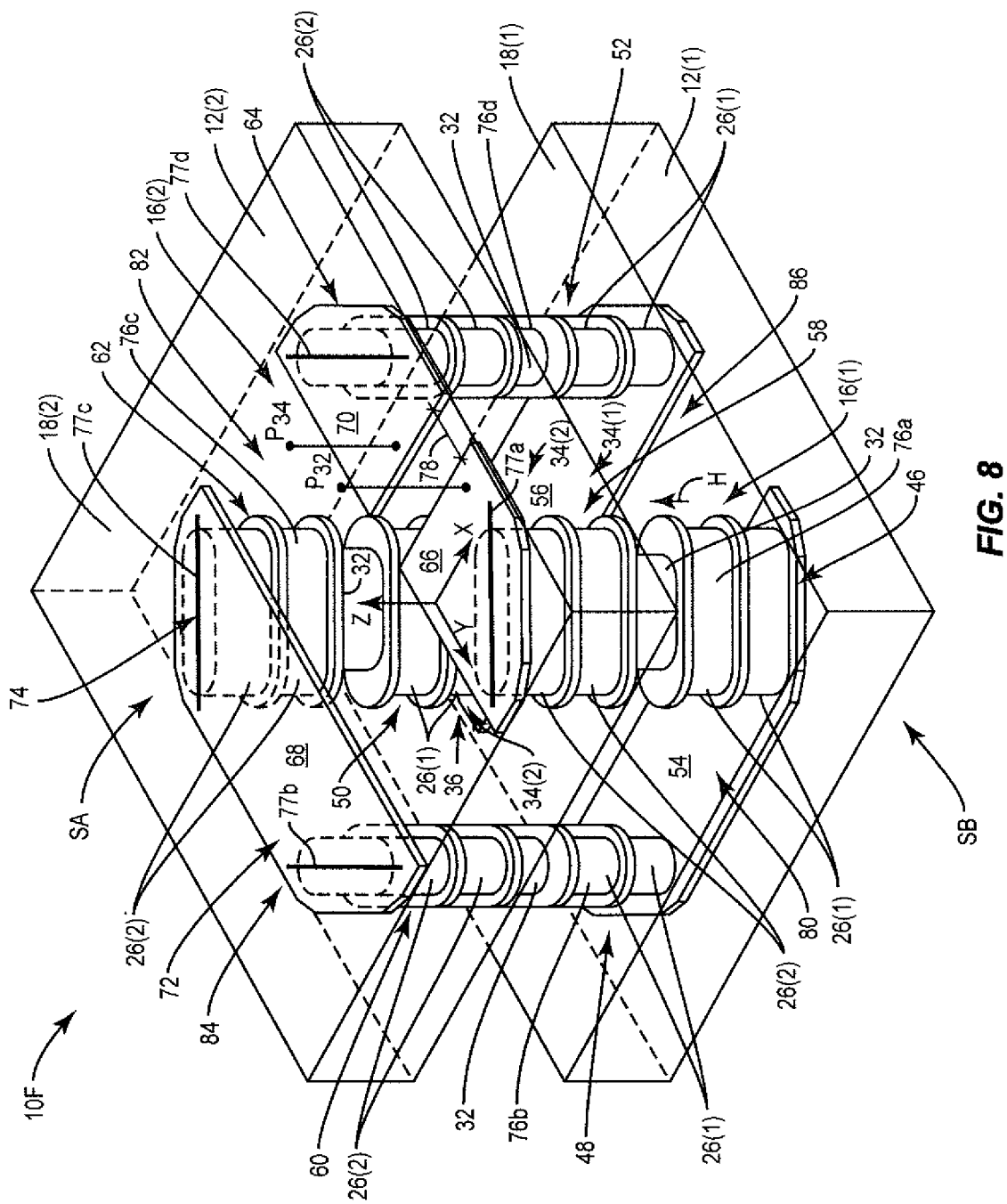
FIG. 8 illustrates one embodiment of the electronic device shown in FIG. 1 and formed with the first substrate shown in FIG. 7A and the second substrate shown in FIG. 7B.

FIG. 8 illustrates an electronic device 10F formed from the first substrate 12(1) shown in FIG. 7A and the second substrate 12(2) shown in FIG. 7B. As shown in FIG. 8, the second substrate 12(2) is mounted onto the first substrate 12(1) such that the first inductor portion 16(1) is electrically connected to the second inductor portion 16(2) with the conductive connection component 32. Furthermore, the second inductor portion 16(2) is positioned over the first inductor portion 16(1) such that the first inductor portion 16(1) and the second inductor portion 16(2) form a 3D inductor 14F, which is one embodiment of the 3D inductor 14 shown in FIG. 1. In this manner, an embodiment of the 3D inductor 14F is formed by the first substrate 12(1) shown in FIG. 7A and the second substrate 12(2) shown in FIG. 7B. The 3D inductor 14F is an embodiment of the 3D inductor 14 shown in FIG. 1. Accordingly, the first inductor portion 16(1) is integrated into the first substrate 12(1) and the second inductor portion 16(2) is integrated into the second substrate 12(2) so as to form a 3D current path of the 3D inductor 14F.

With regard to the 3D inductor 14F shown in FIG. 8, the 3D inductor 14F provides a conductive path 72. The conductive path 72 extends in all three dimensions but curves back in on itself. More specifically, the conductive path 72 has a shape corresponding to a two-dimensional (2D) lobe 74 laid over a three-dimensional (3D) 3D volume 36. In this embodiment, the 2D lobe 74 is approximately shaped as a square (which is a special case of a polygon), and the 3D volume 36 is approximately shaped as a cube (which is a special case of a polynoid). However, as explained in U.S. patent application Ser. No. 14/450,156 filed Aug. 1, 2014, now U.S. Pat. No. 9,899,133, which is hereby incorporated herein by reference in its entirety, the 2D lobe 74 and 3D volume 36 may each be of any 2D shape and 3D shape, respectively.

Note that the 2D lobe 74 is not a 2D structure but is rather a 3D structure, since the 2D lobe 74 is laid over the 3D volume 36. In other words, the 2D lobe 74 would be a 2D structure if the 2D lobe 74 were laid over a 2D plane. However, the 2D lobe 74 is a 3D structure because the 3D volume 36 provides a 3D manifold, and the 2D lobe 74 is folded onto the 3D volume 36. The 2D lobe 74 may be any conductive structure that is at least partially bounded so as to form a loop, since the 2D lobe 74 curves back in on itself. In other words, the face of the 2D lobe 74 has been bent so that at the 2D lobe 74 surrounds a perimeter of a 3D area at the boundary of the 3D volume 36.

To form the conductive path 72, the 3D inductor 14F comprises four elongated via columns (referred to generically as element 76, and specifically as elongated via columns 76a, 76b, 76c, and 76d). Each of the elongated via columns 76 is formed by electrically connecting a corresponding one of the stacks 46, 48, 50, 52 of the first conductive vias 26(1) in the first inductor portion 16(1) of the first substrate 12(1) with a corresponding one of the stacks 58, 60, 62, 64 of the second conductive vias 26(2) in the second inductor portion 16(2) of the second substrate 12(2). In this embodiment, the first stack 58 of the second conductive vias 26(2) is mounted and electrically connected to the first stack 46 of the first conductive vias 26(1) with the conductive connection component 32. Accordingly, the first stack 58 of the second conductive vias 26(2) and the first stack 46 of the first conductive vias 26(1) form the elongated via column 76a. With regard to the example shown in FIG. 8, the first stack 58 of the second conductive vias 26(2) is connected to one of the second surface conductive pads 30(2) provided at the second surface 28(2). The first stack 46 of the first conductive vias 26(1) is also connected to one of the first surface conductive pads 30(1) provided at the first surface 28(1). For example, the second surface conductive pad 30(2) and the first surface conductive pad 30(1) shown in FIG. 8 are attached and electrically connected by a corresponding one of the conductive connection component 32. In this manner, the first stack 58 of the second conductive vias 26(2) and the first stack 46 of the first conductive vias 26(1) form the elongated via column 76a. Note that in other embodiments any other suitable technique for mounting and electrically connecting the first stack 58 and the first stack 46 may be utilized.

Additionally, the second stack 60 of the second conductive vias 26(2) is mounted and electrically connected to the second stack 48 of the first conductive vias 26(1) with the conductive connection component 32. Accordingly, the second stack 60 of the second conductive vias 26(2) and the second stack 48 of the first conductive vias 26(1) form the elongated via column 76b. With regard to the example shown in FIG. 8, the second stack 60 of the second conductive vias 26(2) is connected to one of the second surface conductive pads 30(2) provided at the second surface 28(2). The second stack 48 of the first conductive vias 26(1) is also connected to one of the first surface conductive pads 30(1) provided at the first surface 28(1). For example, the second surface conductive pad 30(2) and the first surface conductive pad 30(1) shown in FIG. 8 are attached and electrically connected by a corresponding one of the conductive connection component 32. In this manner, the second stack 60 of the second conductive vias 26(2) and the second stack 48 of the first conductive vias 26(1) form the elongated via column 76b. Note that in other embodiments any other suitable technique for mounting and electrically connecting the second stack 60 and the second stack 48 may be utilized. Those skilled in the art will appreciate the scope of the present disclosure and realize additional aspects thereof after reading the following detailed description of the preferred embodiments in association with the accompanying drawing figures.

Furthermore, the third stack 62 of the second conductive vias 26(2) is mounted and electrically connected to the third stack 50 of the first conductive vias 26(1) with the conductive connection component 32. Accordingly, the third stack 62 of the second conductive vias 26(2) and the third stack 50 of the first conductive vias 26(1) form the elongated via column 76c. With regard to the example shown in FIG. 8, the third stack 62 of the second conductive vias 26(2) is connected to one of the second surface conductive pads 30(2) provided at the second surface 28(2). The third stack 50 of the first conductive vias 26(1) is also connected to one of the first surface conductive pads 30(1) provided at the first surface 28(1). For example, the second surface conductive pad 30(2) and the first surface conductive pad 30(1) shown in FIG. 8 are attached and electrically connected by a corresponding one of the conductive connection component 32. In this manner, the third stack 62 of the second conductive vias 26(2) and the third stack 50 of the first conductive vias 26(1) form the elongated via column 76c. Note that in other embodiments any other suitable technique for mounting and electrically connecting the third stack 62 and the third stack 50 may be utilized. Those skilled in the art will appreciate the scope of the present disclosure and realize additional aspects thereof after reading the following detailed description of the preferred embodiments in association with the accompanying drawing figures.

Finally, the fourth stack 64 of the second conductive vias 26(2) is mounted and electrically connected to the fourth stack 52 of the first conductive vias 26(1) with the conductive connection component 32. Accordingly, the fourth stack 64 of the second conductive vias 26(2) and the fourth stack 52 of the first conductive vias 26(1) form the elongated via column 76d. With regard to the example shown in FIG. 8, the fourth stack 64 of the second conductive vias 26(2) is connected to one of the second surface conductive pads 30(2) provided at the second surface 28(2). The fourth stack 52 of the first conductive vias 26(1) is also connected to one of the first surface conductive pads 30(1) provided at the first surface 28(1). For example, the second surface conductive pad 30(2) and the first surface conductive pad 30(1) shown in FIG. 8 are attached and electrically connected by a corresponding one of the conductive connection component 32. In this manner, the fourth stack 64 of the second conductive vias 26(2) and the fourth stack 52 of the first conductive vias 26(1) form the elongated via column 76d. Note that in other embodiments any other suitable technique for mounting and electrically connecting the fourth stack 64 and the fourth stack 52 may be utilized. Those skilled in the art will appreciate the scope of the present disclosure and realize additional aspects thereof after reading the following detailed description of the preferred embodiments in association with the accompanying drawing figures.

Also, to form the conductive path 72, the 3D inductor 14F of FIG. 8 also comprises three connector plates 54, 56, and 68. The connector plate 68 connects the elongated via column 76*b* to the elongated via column 76*c* on a first vertical side SA of the 3D inductor 14F. On a second vertical side SB of the 3D inductor 14F that is antipodal to the first vertical side SA, the connector plate 54 connects the elongated via column 76*a* to the elongated via column 76*b*, and the connector plate 56 connects the elongated via column 76*c* to the elongated via column 76*d*. The 3D inductor 14F of FIG. 8 further comprises two terminal plates 66 and 70 to form part of the conductive path 72. The terminal plates 66 and 70 comprise a terminal connection for the 3D inductor 14F and are connected to the elongated via columns 76*a*, 76*d*, respectively, at the first vertical side SA. The terminal plates 66 and 70 can be connected to ports P32 and P34, respectively, for connection to an external component, such as, but not limited to, a tunable capacitor.

Current from the port P32 flows to and across the terminal plate 66 down the elongated via column 76*a* to the connector plate 54. The current flow continues across the connector plate 54 up through the elongated via column 76*b* to the connector plate 68. The current flow then continues across the connector plate 68 down through the elongated via column 76*c* to the connector plate 56. The current flow continues up through the elongated via column 76*d* to the terminal plate 70 and up through the port P34.

Note that the first conductive vias 26(1) and the second conductive vias 26(2) are elongated, and thus each of the elongated via columns 76 are elongated relative to a plane. Accordingly, the elongated via column 76*a* is elongated with respect to a plane 77*a*, the elongated via column 76*b* is elongated with respect to a plane 77*b*, the elongated via column 76*c* is elongated with respect to a plane 77*c*, and the elongated via column 76*d* is elongated with respect to a plane 77*d*. Thus, a cross sectional horizontal area of each of the elongated via columns 76 has a major axis longer than a minor axis. Note also that each of the connector plates 54, 56, 68 are each shaped as a trapezoid where the exterior parallel edge of each the connector plates 54, 56, 68 provides the short base of the trapezoid, while the interior parallel edge of each of the connector plates 54, 56, 68 provides the long base of the trapezoid. The opposite disposed end edges of each the connector plates 54, 56, 68 provide the legs of the trapezoid. In this case, each of the connector plates 54, 56, 68 is shaped as an isosceles trapezoid where an angle between each of the legs to the long base is approximately 45 degrees while an angle between each of the legs and the short base is approximately 135 degrees. Each of the elongated via columns is angled so that each of their respective planes 77 is substantially parallel with the end edge of the connector plates of the respective elongated via column 76 with which the elongated via column connects. Thus, each elongated via column 76 connects to the connector plates 54, 56, 68 such that an angle between the respective plane 77 of the elongated via column 76 and the interior edge of the connector plate 54, 56, 68 it connects to is approximately 45 degrees, while an angle between the respective plane 77 of the elongated via column 76 and the exterior edge of the connector plate 54, 56, 68 it connects to is approximately 135 degrees. Similarly, the terminal plates 66, 70 are each shaped as trapezoids, but in this case, right trapezoids. However, the combination of the terminal plates 66, 70 would form the same trapezoid as the connector plates 54, 56, 68 except that there is a gap between each of the right angled edges terminal plates 66, 70. Each of the angled edges of the terminal plates 66, 70 (where the terminal plates 66, 70 connect to the elongated via columns 76*a*, 76*d*) has the same angular relationship with the elongated via columns 76*a*, 76*d* as each of the connector plates 54, 56, 68 has with the elongated via columns 76*a*, 76*b*, 76*c*, 76*d*. These angular relationships allow the conductive path 72 to wrap symmetrically in three dimensions while preventing current crowding by maintaining substantially equal current paths.

Note then that each of the elongated via columns 76 has an interior column surface and an exterior column surface oppositely disposed from one another. For each of the elongated via columns 76, the interior column surface faces toward an interior of the 3D inductor 14F, while the exterior column surface faces toward an exterior of the 3D inductor 14F. As shown in FIG. 8, the plane 77*a* and the plane 77*c* are substantially parallel so that an interior column surface of the elongated via column 76*a* and an interior column surface of the elongated via column 76*c* face one another. Furthermore, the plane 77*b* and the plane 77*d* are substantially parallel so that the interior column surface of the elongated via column 76*b* and the interior column surface of the elongated via column 76*d* face one another. However, the plane 77*a* and the plane 77*c* are each transverse to both the plane 77*b* and the plane 77*d*. The planes 77*a*, 77*b*, 77*c*, and 77*d* thus all intersect at vertical side SA to define a square footprint and all intersect at vertical side SB to define another square footprint.

With regard to the embodiment of the 3D inductor 14F shown in FIG. 8, the conductive path 72 of the 2D lobe 74 extends from the terminal plate 66 to the terminal plate 70. The 2D lobe 74 is open so as to define a gap 78 in the 2D lobe 74 between the terminal plate 66 and the terminal plate 70. The 2D lobe 74 is formed such that the conductive path 72 extends out of the terminal plate 66 and loops back to the terminal plate 70 back towards the gap 78. The terminal plate 66 is connected to a connecting end of the elongated via column 76*a* at the side SA. In this embodiment, the conductive path 72 forms a first turn 80 of the 3D inductor 14F. To form the first turn 80, the connector plate 54 is connected to a connecting end of the elongated via column 76*a* at the side SB. Also, the connector plate 54 is connected to a connecting end of the elongated via column 76*b* at the vertical side SB. In this manner, the elongated via column 76*a*, the connector plate 54, and the elongated via column 76*b* form the first turn 80. The connector plate 68 provides a bend that bounds the 2D lobe 74 so that the 2D lobe 74 curves back on itself. The connector plate 68 is connected to a connecting end of the elongated via column 76*c* at the vertical side SA. The conductive path 16 forms a second turn 82 of the 3D inductor 14F that loops the 2D lobe 74 back toward the gap 78 and the terminal plate 70. To form the second turn 82, the connector plate 56 is connected to a connecting end of the elongated via column 76*c* at the vertical side SB. The connector plate 56 is also connected to a connecting end of the elongated via column 76*d* at the vertical side SB. Thus, the elongated via column 76*c*, the connector plate 56, and the elongated via column 76*d* form the second turn 82. Furthermore, note that the first turn 80 and the second turn 82 are connected to form a third turn 84. More specifically, the elongated via column 76*b*, the connector plate 68, and the elongated via column 76*c* form the third turn 84.

The magnetic field H is generated by the 3D inductor 14F in response to a current. The intensity and direction of the magnetic field is indicated by the size of the cones. By laying the 2D lobe 74 of the conductive path 72 of the 3D inductor 14F over the 3D volume 36, the conductive path 72 is configured to generate a magnetic field H that predominately embraces the conductive path 72 along an interior of the 3D inductor 14F. Thus, the magnetic field H predominately embraces the interior surfaces of the elongated via column 76a, the elongated via column 76b, the elongated via column 76c, the elongated via column 76d, the connector plate 68, the 3D volume 36, the terminal plate 66, and the terminal plate 70. The magnetic field H gets weaker towards a geometric centroid of the 3D inductor 14F. A majority of magnetic energy of the magnetic field H is stored inside the 3D inductor 14F and within the 3D volume 36. Also, the magnetic field lines of the magnetic field H are predominately destructive on an exterior of the 3D inductor 14F and the 3D volume 36 of the 3D inductor 14F. The magnetic field lines of the magnetic field H are predominately destructive outside the 3D inductor 14F and the 3D volume 36 because magnetic field line subtraction dominates outside the 3D inductor 14F and the 3D volume 36 so that a minority of the magnetic energy of the magnetic field H is stored outside of the 3D inductor 14F and the 3D volume 36. In this example, the 3D volume 36 includes the 3D volume 34(1) of the first inductor portion 16(1) of the first substrate 12(1) and the 3D volume 34(2) of the second inductor portion 16(2) of the second substrate 12(2).

As shown in FIG. 8, the 2D lobe 74 is laid over the 3D volume 36 such that the conductive path 72 extends in three orthogonal spatial dimensions. Thus, an RF signal propagates through conductive path 72 in three orthogonal spatial dimensions, and the conductive path 72 is a 3D conductive path. As such, all three spatial dimensions are required to describe signal propagation throughout the 2D lobe 74. Direction indicators are drawn throughout the conductive path 72 to indicate directions of current propagation throughout the 3D inductor 14F. The spreading of the magnetic field H in all three dimensions helps achieve weak coupling, since little energy is concentrated in any given direction.

An x-axis, a y-axis, and a z-axis are shown in FIG. 8 with an origin at a geometric centroid of the 3D inductor 14F and the 3D volume 36. As shown in FIG. 8, the first turn 80 and the second turn 82 face one another and are substantially symmetrical with respect to an x-z plane. The connector plate 68 connects the first turn 80 and the second turn 82 so that the third turn faces the y-z plane, which is traverse to the x-z plane. The 3D inductor 14F does not have symmetry with respect to the x-y plane, which is orthogonal to both the x-z plane and the y-z plane. However, on one side of the x-y plane, the 3D inductor 14F is bounded, while on another side of the x-y plane, the 3D inductor 14F is unbounded.

Due to the symmetry of the 3D inductor 14F shown in FIG. 8, the 2D lobe 74 of the 3D inductor 14F is laid over the 3D volume 36 such that most inductor segments have a corresponding inductor segment in the 3D inductor 14F such that current propagation in the inductor segments is antipodal. For instance, except for the gap 78, inductor segments in the first turn 80 located on one side of the x-z plane have a corresponding inductor segment in the second turn 82 located on the other side of the x-z plane where current propagation is antipodal. Similarly, except for the gap 78, inductor segments in the third turn 84 located on one side of the y-z plane have a corresponding inductor segment relative to a segmented fourth turn 86 located on the other side of the y-z plane. The segmented fourth turn 86 is formed by the terminal plate 66, the elongated via column 76a, the elongated via column 76d, and the terminal plate 70. Accordingly, the magnetic field lines of the magnetic field H that predominately embrace the conductive path 72 are predominately subtractive (canceling partially or completely) outside the 3D inductor 14F. However, lack of symmetry with respect to the x-y plane ensures that this is not entirely the case throughout.

It should be noted that the 3D inductor 14F of the electronic device 10F shown in FIG. 8 may have any one of the arrangements of the electronic devices 10A-10C described above with respect to FIGS. 2-4. Thus, the 3D inductor 14F can be provided with the first substrate 12(1) and the second substrate 12(2) having different relative sizes as described above with respect to FIGS. 2-4.

For example, the 3D inductor 14F of the electronic device 10F shown in FIG. 8 may be provided in accordance with 3D inductor 14A of the electronic device 10A of FIG. 2. Assuming that the first conductive vias 26(1) and the second conductive vias 26(2) (along with associated carrier pads) are provided so as to be the same size and shape in both the first substrate 12(1) and the second substrate 12(2) of the 3D inductor 14F shown in FIG. 8, the 3D inductor 14F may be provided as an implementation of the 3D inductor 14A shown in FIG. 2 by having the same number of the first conductive vias 26(1) in the first stack 46 as the number of the second conductive vias 26(2) in the first stack 58, the same number of the first conductive vias 26(1) in the second stack 48 as the number of the second conductive vias 26(2) in the second stack 60, same number of the first conductive vias 26(1) in the third stack 50 as the number of the second conductive vias 26(2) in the third stack 62, and the same number of the first conductive vias 26(1) in the fourth stack 52 as the number of the second conductive vias 26(2) in the fourth stack 64 Thus, in this example, the thickness of the first substrate 12(1) would be substantially equal to the thickness of the second substrate 12(2).

In another example, the 3D inductor 14F of the electronic device 10F shown in FIG. 8 may be provided in accordance with 3D inductor 14B of the electronic device 10B of FIG. 3. Assuming that the first conductive vias 26(1) and the second conductive vias 26(2) (along with associated carrier pads) are provided so as to be the same size and shape in both the first substrate 12(1) and the second substrate 12(2) of the 3D inductor 14F shown in FIG. 8, the 3D inductor 14F may be provided as an implementation of the 3D inductor 14B shown in FIG. 3 by having a greater number of the first conductive vias 26(1) in the first stack 46 than the number of the second conductive vias 26(2) in the first stack 58, a greater number of the first conductive vias 26(1) in the second stack 48 than the number of the second conductive vias 26(2) in the second stack 60, a greater number of the first conductive vias 26(1) in the third stack 50 than the number of the second conductive vias 26(2) in the third stack 62, and a greater number of the first conductive vias 26(1) in the fourth stack 52 as the number of the second conductive vias 26(2) in the fourth stack 64 Thus, in this example, the thickness of the first substrate 12(1) would be greater than the thickness of the second substrate 12(2).

In still another example, the 3D inductor 14F of the electronic device 10F shown in FIG. 8 may be provided in accordance with 3D inductor 14C of the electronic device 10C of FIG. 4. Assuming that the first conductive vias 26(1) and the second conductive vias 26(2) (along with associated carrier pads) are provided so as to be the same size and shape in both the first substrate 12(1) and the second substrate 12(2) of the 3D inductor 14F shown in FIG. 8, the 3D inductor 14F may be provided as an implementation of the 3D inductor 14C shown in FIG. 4 by having a smaller number of the first conductive vias 26(1) in the first stack 46 than the number of the second conductive vias 26(2) in the first stack 58, a smaller number of the first conductive vias 26(1) in the second stack 48 than the number of the second conductive vias 26(2) in the second stack 60, a smaller number of the first conductive vias 26(1) in the third stack 50 than the number of the second conductive vias 26(2) in the third stack 62, and a smaller number of the first conductive vias 26(1) in the fourth stack 52 as the number of the second conductive vias 26(2) in the fourth stack 64 Thus, in this example, the thickness of the first substrate 12(1) would be less than the thickness of the second substrate 12(2).

It should also be noted that the electronic device 10F that provides the 3D inductor 14F may be an IC package having any one of the arrangements of the electronic devices 10D-10E described above with respect to FIGS. 5-6. For example, the overmold 38 (shown in FIG. 5) may be provided to cover the first surface 28(1) of the first substrate 12(1) and the second substrate 12(2) and thus be one implementation of the electronic device 10D shown in FIG. 5. In another example, the undermold 44 may be provided over the first surface 28(1) and underneath the second surface 28(2) and thus be one implementation of the electronic device 10F shown in FIG. 6. The conductive connection components 32 in FIG. 8 may also be provided in accordance with any of the embodiments described above in FIGS. 1A-1D or any combination thereof.

Figure 9A:
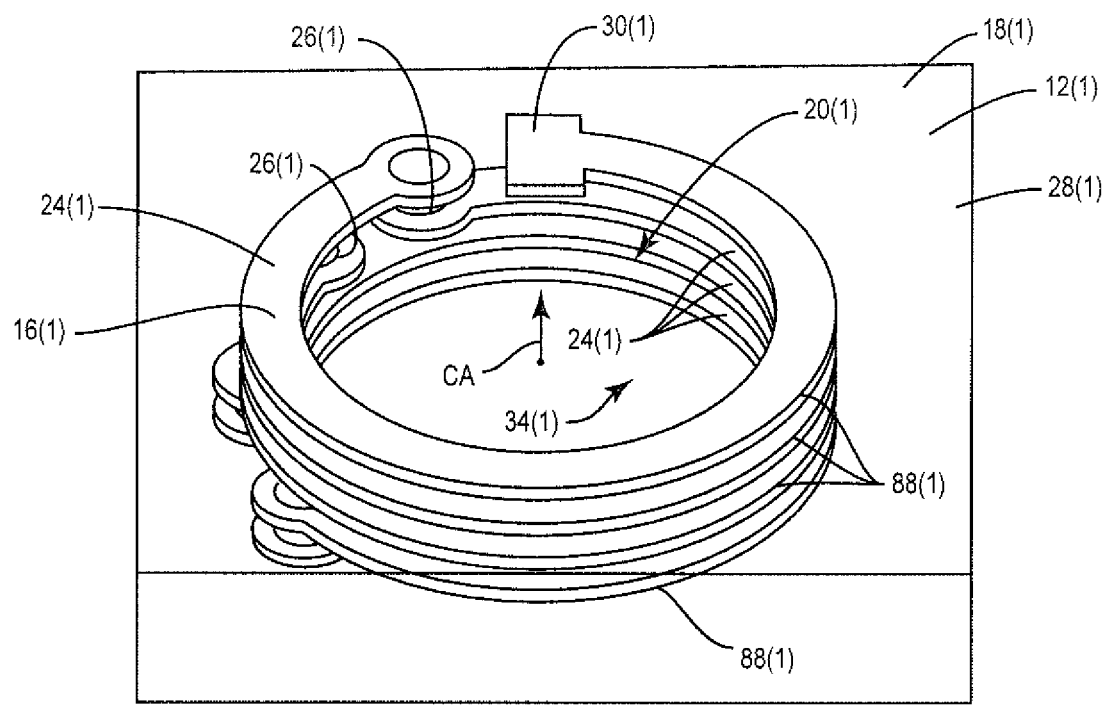
FIG. 9A illustrates one embodiment of the first substrate shown in FIG. 1 having multiple windings.
Figure 9B:
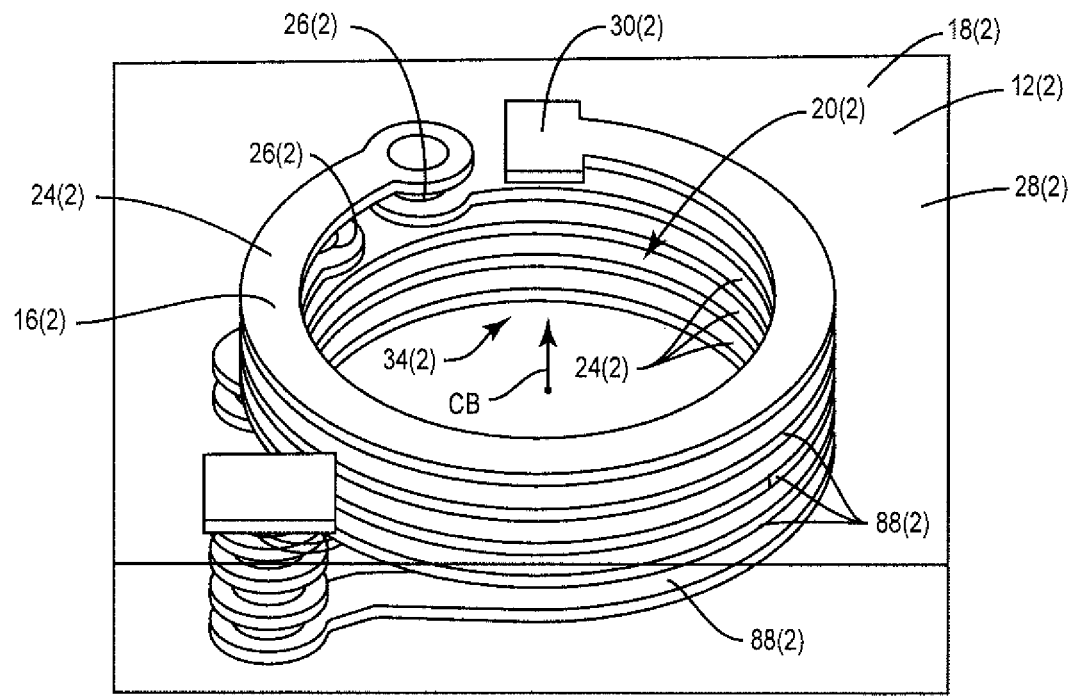
FIG. 9B illustrates one embodiment of the second substrate shown in FIG. 1 also having multiple windings.

Referring now to FIG. 9A and FIG. 9B, FIG. 9A and FIG. 9B illustrate embodiments of the first substrate 12(1) and the second substrate 12(2) utilized to form one embodiment of the 3D inductor 14 shown in FIG. 1. FIG. 9A illustrates one embodiment of the first substrate 12(1) where the first conductive structure 20(1) of the first substrate 12(1) includes one embodiment of the first inductor portion 16(1). FIG. 9B illustrates one embodiment of the second substrate 12(2) where the second conductive structure 20(2) of the second substrate 12(2) includes one embodiment of the second inductor portion 16(2). By mounting the second substrate 12(2) on the first substrate 12(1), the second inductor portion 16(2) is connected to the first inductor portion 16(1) so as to form one embodiment of the 3D inductor 14 shown in FIG. 1, as explained in further detail below.

Referring now specifically to FIG. 9A, the first inductor portion 16(1) shown in FIG. 9A is formed as a plurality of windings 88(1) that are connected to one another so that current can propagate though the windings 88(1). The windings 88(1) are aligned and wound about a common axis CA. In this embodiment, the windings 88(1) are circular but may be of any suitable shape in alternative embodiments. Each of the windings 88(1) is formed by one of the first metallic layers 24(1). Adjacent pairs of the windings 88(1) are each connected by the first conductive vias 26(1) so that the current can propagate between each of the windings 88(1) that form the first inductor portion 16(1) in the same current direction. The windings 88(1) provide the perimeter of the 3D volume 34(1) enclosed by the first inductor portion 16(1). A first surface conductive pad 30(1) is connected to a final end of the winding 88(1) at or near the first surface 28(1) so that the first inductor portion 16(1) can be electrically connected to the second inductor portion 16(2) with the conductive connection component 32 when the second substrate 12(2) is mounted on the first substrate 12(1). The conductive connection components 32 in FIG. 9A may also be provided in accordance with any of the embodiments described above in FIGS. 1A-1D or any combination thereof.

Referring now specifically to FIG. 9B, the second inductor portion 16(2) shown in FIG. 9B is formed as a plurality of windings 88(2) that are connected to one another so that current can propagate though the windings 88(2). The windings 88(2) are aligned and wound about a common axis CB. In this embodiment, the windings 88(2) are circular but may be of any suitable shape in alternative embodiments. Each of the windings 88(2) is formed by one of the second metallic layers 24(2) in the same current direction. Adjacent pairs of the windings 88(2) are each connected by the second conductive vias 26(2) so that current can propagate between each of the windings 88(2) that form the second inductor portion 16(2). The windings 88(2) provide the perimeter of the 3D volume 34(2) enclosed by the second inductor portion 16(2). A second surface conductive pad 30(2) is connected to an initial end of the winding 88(2) at or near the second surface 28(2) so that the second inductor portion 16(2) can be electrically connected to the first inductor portion 16(1) with the conductive connection component 32 when the second substrate 12(2) is mounted on the first substrate 12(1). The conductive connection components 32 in FIG. 9B may also be provided in accordance with any of the embodiments described above in FIGS. 1A-1D or any combination thereof.

FIG. 10 illustrates an electronic device 10G formed from the first substrate 12(1) shown in FIG. 9A and the second substrate 12(2) shown in FIG. 9B. As shown in FIG. 10, the second substrate 12(2) is mounted onto the first substrate 12(1) such that the first inductor portion 16(1) is electrically connected to the second inductor portion 16(2) with the conductive connection components 32. Furthermore, the second inductor portion 16(2) is positioned over the first inductor portion 16(1) such that the first inductor portion 16(1) and the second inductor portion 16(2) form an 3D inductor 14G, which is one embodiment of the 3D inductor 14 shown in FIG. 1. In this manner, an embodiment of the 3D inductor 14G is formed by the first substrate 12(1) shown in FIG. 9A and the second substrate 12(2) shown in FIG. 9B. The 3D inductor 14G is an embodiment of the 3D inductor 14 shown in FIG. 1.

Accordingly, the first inductor portion 16(1) is integrated into the first substrate 12(1) and the second inductor portion 16(2) is integrated into the second substrate 12(2) so as to form a 3D current path of the 3D inductor 14G.

With regard to the 3D inductor 14G shown in FIG. 10, the 3D inductor 14G provides a conductive path 90. The conductive path 90 is formed by the windings 88(1), 88(2), the conductive vias 26(1), 26(2) (which connect the windings 88(1), 88(2)), the surface conductive pads 30(1), 30(2), and the conductive connection component 32. The conductive connection component 32 connect the surface conductive pads 30(1), 30(2) and therefore the first inductor portion 16(1) of the first substrate 12(1) to the second inductor portion 16(2) of the second substrate 12(2). The conductive path 90 extends in all three dimensions but extends continuously in the z-direction and thus does not fully curve back into itself. In this embodiment, the common axis CA (shown in FIG. 9A) and the common axis CB (shown in FIG. 9B) are the same. Accordingly, the windings 88(1) of the first inductor portion 16(1) and the windings 88(1) of the second inductor portion 16(2) are all wound and substantially aligned around a common axis CC. Accordingly, the 3D volume 34(1) (shown in FIG. 9A) enclosed by the first inductor portion 16(1) and the 3D volume 34(2) (shown in FIG. 9B) enclosed by the second inductor portion 16(2) are aligned so that the 3D volume 36 enclosed by the 3D inductor 14G is contiguous and includes both the 3D volume 34(1) (shown in FIG. 9A) enclosed by the first inductor portion 16(1) and the 3D volume 34(2) (shown in FIG. 9B) enclosed by the second inductor portion 16(2).

Note that in this embodiment, the 3D inductor 14G is a solenoid coil, and the windings 88(1), 88(2) of the 3D inductor 14G are circular. In alternative embodiments, the windings 88(1), 88(2) may be of any suitable shape. Additionally, the second substrate 12(2) is mounted on the first substrate 12(1) so that the second surface conductive pad 30(2) is directly over the first surface conductive pad 30(1). In this manner, the conductive connection component 32 connects the first surface conductive pad 30(1) and the second surface conductive pad 30(2) of the second conductive vias 26(2) so that the first inductor portion 16(1) and the second inductor portion 16(2) form the conductive path 90 of the 3D inductor 14B. Note that in other embodiments any other suitable technique for mounting and electrically connecting the windings 88(2) to the windings 88(1).

With regard to the embodiment of the 3D inductor 14G shown in FIG. 10, the conductive path 90 of the 3D inductor 14G extends from an initial end of the winding 88(1) furthest from the first surface 28(1) to a final end of the winding 88(2) furthest from the second surface 28(2). A magnetic field H is generated by the 3D inductor 14G in response to a current propagating through the conductive path 90. Since 3D inductor 14G is a solenoidal coil, the magnetic field H within the 3D volume 36 will be predominately aligned with the common axis CC since vector components of the magnetic field H unaligned with the common axis CC predominately cancel.

It should be noted that the 3D inductor 14G of the electronic device 10G shown in FIG. 10 may have any one of the arrangements of the electronic devices 10A-10C described above with respect to FIGS. 2-4. Thus, the 3D inductor 14G can be provided with the first substrate 12(1) and the second substrate 12(2) having different relative sizes as described above with respect to FIGS. 2-4.

For example, the 3D inductor 14G of the electronic device 10G shown in FIG. 10 may be provided in accordance with 3D inductor 14A of the electronic device 10A of FIG. 2. Assuming that the first metallic layers 24(1) and the second metallic layers 24(2) are provided so as to have the same thickness in both the first substrate 12(1) and the second substrate 12(2) of the 3D inductor 14G shown in FIG. 10, the 3D inductor 14G may be provided as an implementation of the 3D inductor 14A shown in FIG. 2 by having the same number of the windings 88(1) in the first substrate body 18(1) of the first substrate 12(1) as the number of windings 88(2) in the second substrate body 18(2) of the second substrate 12(2). Thus, in this example, the thickness of the first substrate 12(1) would be substantially the same as the thickness of the second substrate 12(2).

In another example, the 3D inductor 14G of the electronic device 10G shown in FIG. 10 may be provided in accordance with 3D inductor 14B of the electronic device 10B of FIG. 3. Assuming that the first metallic layers 24(1) and the second metallic layers 24(2) are provided so as to have the same thickness in both the first substrate 12(1) and the second substrate 12(2) of the 3D inductor 14G shown in FIG. 10, the 3D inductor 14G may be provided as an implementation of the 3D inductor 14B shown in FIG. 3 by having a greater number of the windings 88(1) in the first substrate body 18(1) of the first substrate 12(1) than the number of windings 88(2) in the second substrate body 18(2) of the second substrate 12(2). Thus, in this example, the thickness of the first substrate 12(1) would be greater than the thickness of the second substrate 12(2).

In still another example, the 3D inductor 14G of the electronic device 10G shown in FIG. 10 may be provided in accordance with 3D inductor 14C of the electronic device 10C of FIG. 4. Assuming that the first metallic layers 24(1) and the second metallic layers 24(2) are provided so as to have the same thickness in both the first substrate 12(1) and the second substrate 12(2) of the 3D inductor 14G shown in FIG. 10, the 3D inductor 14G may be provided as an implementation of the 3D inductor 14C shown in FIG. 4 by having a fewer number of the windings 88(1) in the first substrate body 18(1) of the first substrate 12(1) than the number of windings 88(2) in the second substrate body 18(2) of the second substrate 12(2). Thus, in this example, the thickness of the first substrate 12(1) would be less than the thickness of the second substrate 12(2).

It should also be noted that the electronic device 10G that provides the 3D inductor 14G may be an IC package having any one of the arrangements of the electronic devices 10D-10E described above with respect to FIGS. 5-6. For example, the overmold 38 (shown in FIG. 5) may be provided to cover the first surface 28(1) of the first substrate 12(1) and the second substrate 12(2) and thus be one implementation of the electronic device 10D shown in FIG. 5. In another example, the undermold 44 may be provided over the first surface 28(1) and underneath the second surface 28(2) and thus be one implementation of the electronic device 10G shown in FIG. 6. The conductive connection components 32 in FIG. 10 may also be provided in accordance with any of the embodiments described above in FIGS. 1A-1D or any combination thereof.

Those skilled in the art will recognize improvements and modifications to the preferred embodiments of the present disclosure. All such improvements and modifications are considered within the scope of the concepts disclosed herein and the claims that follow.

What is claimed is:

1. An electronic device comprising:
a first substrate comprising a first substrate body and a first inductor portion integrated into the first substrate body;
a second substrate comprising a second substrate body and a second inductor portion integrated into the second substrate body; and
a conductive connection component, wherein:
the second substrate is mounted on the first substrate such that the second inductor portion is positioned over the first inductor portion, wherein the first substrate body is separate from the second substrate body with a gap in between;
the second inductor portion is electrically connected to the first inductor portion so that the first inductor portion and the second inductor portion form a three dimensional (3D) inductor; and
the first inductor portion includes a first stack of conductive vias and the second inductor portion includes a second stack of conductive vias, wherein:
each of the first stack of conductive vias is aligned with one another, and each of the second stack of conductive vias is aligned with one another;
adjacent conductive vias of the first stack of conductive vias do not have non-conductive material in between and adjacent conductive vias of the second stack of conductive vias do not have non-conductive material in between; and
the second stack of conductive vias is mounted on and electrically connected to the first stack of conductive vias by the conductive connection component, which resides within the gap, to form a first elongated column of conductive vias, such that current eligible to propagate vertically along the first elongated column.

2. The electronic device of claim 1 wherein:
the first inductor portion encloses a first volume within the first substrate; and
the second inductor portion encloses a second volume within the second substrate wherein the 3D inductor encloses a third volume that includes the first volume within the first substrate and the second volume within the second substrate.

3. The electronic device of claim 2 wherein the first inductor portion and the second inductor portion form a 3D current path of the 3D inductor.

4. The electronic device of claim 2 wherein the second inductor portion is positioned directly over the first inductor portion.

5. The electronic device of claim 1 wherein the first substrate further comprises a first conductive structure integrated into the first substrate body and the second substrate further comprises a second conductive structure integrated into the second substrate body and wherein:
the first conductive structure includes the first inductor portion; and
the second conductive structure includes the second inductor portion.

6. The electronic device of claim 5 wherein:
the first substrate body comprises a plurality of first substrate layers stacked on each other;
the first conductive structure comprises a plurality of first metallic layers wherein each of the plurality of first metallic layers is stacked over one another and each pair of the plurality of first metallic layers sandwiches one of the plurality of first substrate layers, and the first stack of conductive vias provides an electric connection to each of the plurality of first metallic layers;
the second substrate body comprises a plurality of second substrate layers stacked on each other; and
the second conductive structure comprises a plurality of second metallic layers wherein each of the plurality of second metallic layers is stacked over one another and each pair of the plurality of second metallic layers sandwiches one of the plurality of second substrate layers, and the second stack of conductive vias provides an electric connection to each of the plurality of second metallic layers.

7. The electronic device of claim 6 wherein:
a number of the plurality of first metallic layers is equal to a number of the plurality of second metallic layers; and
a number of the plurality of first substrate layers is equal to a number of the plurality of second substrate layers.

8. The electronic device of claim 6 wherein:
a number of the plurality of first metallic layers is greater than a number of the plurality of second metallic layers; and
a number of the plurality of first substrate layers is greater than a number of the plurality of second substrate layers.

9. The electronic device of claim 8 wherein the first substrate has a first thickness and the second substrate has a second thickness wherein the first thickness is greater than the second thickness.

10. The electronic device of claim 6 wherein:
a number of the plurality of first metallic layers is less than a number of the plurality of second metallic layers; and
a number of the plurality of first substrate layers is less than a number of the plurality of second substrate layers.

11. The electronic device of claim 10 wherein the first substrate has a first thickness and the second substrate has a second thickness wherein the second thickness is greater than the first thickness.

12. The electronic device of claim 1 wherein the conductive connection component is selected from a group consisting of a solder ball, direct solder, a copper pillar, and a wire bond so that the conductive connection component is provided as any combination from the group.

13. The electronic device of claim 1 wherein the electronic device is an integrated circuit (IC) package further comprising an overmold and wherein:
the first substrate has a first surface wherein the first substrate is a package laminate of the IC package;
the second substrate has a second surface and the second substrate is an auxiliary laminate of the IC package;
the second substrate is mounted on the first substrate so that the second surface of the second substrate faces the first surface of the first substrate; and
the overmold is formed over the first surface so as to cover the second substrate.

14. The electronic device of claim 1 wherein the electronic device is an integrated circuit (IC) package further comprising an undermold and wherein:
the first substrate has a first surface wherein the first substrate is a package laminate of the IC package;
the second substrate has a second surface and the second substrate is an auxiliary laminate of the IC package;
the second substrate is mounted on the first substrate so that the second surface of the second substrate faces the first surface of the first substrate; and
the undermold is formed over the first surface between the first surface and the second surface.

15. The electronic device of claim 1 wherein the 3D inductor has a shape corresponding to a two-dimensional (2D) lobe laid over a 3D volume.

16. The electronic device of claim 1 wherein the first inductor portion further comprises a connector plate and wherein:
the first inductor portion includes a third stack of conductive vias;
the second inductor portion includes a fourth stack of conductive vias; and
the fourth stack of conductive vias is mounted on and electrically connected to the third stack of conductive vias such that the third stack of conductive vias and the fourth stack of conductive vias form a second elongated column of conductive vias, wherein the connector plate connects the first elongated column of conductive vias to the second elongated column of conductive vias.

17. The electronic device of claim 1 wherein the second inductor portion further comprises a connector plate and wherein:
the first inductor portion includes a third stack of conductive vias;
the second inductor portion includes a fourth stack of conductive vias; and
the fourth stack of conductive vias is mounted on and electrically connected to the third stack of conductive vias such that the third stack of conductive vias and the fourth stack of conductive vias form a second elongated column of conductive vias, wherein the connector plate connects the first elongated column of conductive vias to the second elongated column of conductive vias.

18. The electronic device of claim 1 wherein the first inductor portion comprises a first plurality of windings and the second inductor portion comprises a second plurality of windings wherein the first plurality of windings and the second plurality of windings are electrically connected such that the 3D inductor is a solenoid coil.

19. The electronic device of claim 18 wherein the first plurality of windings and the second plurality of windings are each aligned about a common axis.

20. The electronic device of claim 1 further comprises a post, which is formed between the first substrate and the second substrate, and in contact with both the first substrate body and the second substrate body.

21. The electronic device of claim 1 wherein:
- the first substrate further comprises a first surface conductive pad formed on a top surface of the first substrate body and electrically connected to the first inductor portion;
- the second substrate further comprises a second surface conductive pad formed on a bottom surface of the second substrate body and electrically connected to the second inductor portion; and
- the conductive connection component is in contact with both the first surface conductive pad and the second surface conductive pad, such that the first surface conductive pad is electrically connected to the second surface conductive pad.

* * * * *

UNITED STATES PATENT AND TRADEMARK OFFICE
CERTIFICATE OF CORRECTION

PATENT NO. : 10,796,835 B2  
APPLICATION NO. : 15/208780  
DATED : October 6, 2020  
INVENTOR(S) : Michael F. Zybura et al.

Page 1 of 1

It is certified that error appears in the above-identified patent and that said Letters Patent is hereby corrected as shown below:

In the Claims

Claim 1, Column 25, Lines 1-2, replace "such that current eligible to propagate vertically along the first elongated column" with --such that current is eligible to propagate vertically along the first elongated column--.

Signed and Sealed this  
Fifth Day of January, 2021

Andrei Iancu  
*Director of the United States Patent and Trademark Office*